US012588419B2

(12) United States Patent
Lee et al.

(10) Patent No.: US 12,588,419 B2
(45) Date of Patent: Mar. 24, 2026

(54) PIEZOELECTRIC SINGLE CRYSTAL INCLUDING INTERNAL ELECTRIC FIELD, METHOD FOR MANUFACTURING SAME, AND PIEZOELECTRIC AND DIELECTRIC APPLICATION COMPONENTS USING SAME

(71) Applicant: CERACOMP CO., LTD., Asan-si (KR)

(72) Inventors: Ho Yong Lee, Seoul (KR); Won Sun Baick, Seoul (KR); Moon Chan Kim, Seoul (KR); Hyun Taek Oh, Seoul (KR); Hyun Jae Joo, Incheon (KR)

(73) Assignee: CERACOMP CO., LTD., Asan-si (KR)

( * ) Notice: Subject to any disclaimer, the term of this patent is extended or adjusted under 35 U.S.C. 154(b) by 396 days.

(21) Appl. No.: 17/928,608

(22) PCT Filed: Dec. 8, 2021

(86) PCT No.: PCT/KR2021/018539
§ 371 (c)(1),
(2) Date: Nov. 29, 2022

(87) PCT Pub. No.: WO2022/124794
PCT Pub. Date: Jun. 16, 2022

(65) Prior Publication Data
US 2023/0329120 A1 Oct. 12, 2023

(30) Foreign Application Priority Data

Dec. 11, 2020 (KR) ........................ 10-2020-0173613
Dec. 11, 2020 (KR) ........................ 10-2020-0173711
(Continued)

(51) Int. Cl.
| | |
|---|---|
| *H10N 30/853* | (2023.01) |
| *H10N 30/074* | (2023.01) |
| *H10N 30/097* | (2023.01) |

(52) U.S. Cl.
CPC ....... *H10N 30/8548* (2023.02); *H10N 30/074* (2023.02); *H10N 30/097* (2023.02); *H10N 30/8561* (2023.02)

(58) Field of Classification Search
CPC .......... H10N 30/8548; H10N 30/8561; H10N 30/074; H10N 30/097
(Continued)

(56) References Cited

U.S. PATENT DOCUMENTS

| | | | |
|---|---|---|---|
| 2008/0290315 A1* | 11/2008 | Lee | ......................... C30B 29/32 |
| | | | 252/62.9 PZ |
| 2009/0212667 A1 | 8/2009 | Matsushita | |

(Continued)

FOREIGN PATENT DOCUMENTS

| | | |
|---|---|---|
| JP | 2019033255 A | 2/2019 |
| KR | 100564092 | 3/2006 |

(Continued)

OTHER PUBLICATIONS

International Search Report—PCT/KR2021/018539 dated Mar. 25, 2022.

(Continued)

*Primary Examiner* — Anita Nassiri-Motlagh
(74) *Attorney, Agent, or Firm* — CANTOR COLBURN LLP

(57) ABSTRACT

Provided is a piezoelectric single crystal comprising an internal bias electric field, a method of manufacturing the same, and piezoelectric and dielectric application components using the piezoelectric single crystal. The piezoelectric single crystal shows that as a change in each composition of
(Continued)

[A] site ions, [B] site ions and [O] site ions from a perovskite type crystal structure ([A][B]O$_3$), and oxygen partial-pressure during heat treatment in terms of a manufacturing process are controlled, while maintaining the inherent high dielectric constant and piezoelectric constant, the high internal bias electric field (EI) characteristic essential for the electrical stability of the piezoelectric single crystal is simultaneously satisfied. Therefore, piezoelectric application components and dielectric application components using the piezoelectric single crystal having excellent characteristics can be used in a wide temperature range and operating voltage conditions.

19 Claims, 8 Drawing Sheets

(30)      Foreign Application Priority Data

Dec. 3, 2021    (KR) ........................ 10-2021-0171667
Dec. 3, 2021    (KR) ........................ 10-2021-0171669

(58)    Field of Classification Search
        USPC .................................................... 252/62.9 PZ
        See application file for complete search history.

(56)                    References Cited

U.S. PATENT DOCUMENTS

2013/0335488 A1    12/2013    Watanabe et al.
2015/0372219 A1    12/2015    Yamashita et al.

FOREIGN PATENT DOCUMENTS

KR          100743614          7/2007
KR          20130132988        12/2013
KR          101779899          9/2017

OTHER PUBLICATIONS

Park et al., Characteristics of Relaxor-Based Piezoelectric Single Crystals for Ultrasonic Transducers, IEEE Transactions on Ultrasonics, Ferroelectrics, and Frequency Control, vol. 44, No. 5, Sep. 1997, pp. 1140-1147.

* cited by examiner

PIEZOELECTRIC SINGLE CRYSTAL INCLUDING INTERNAL ELECTRIC FIELD, METHOD FOR MANUFACTURING SAME, AND PIEZOELECTRIC AND DIELECTRIC APPLICATION COMPONENTS USING SAME

TECHNICAL FIELD

The present invention relates to a piezoelectric single crystal comprising an internal bias electric field, a method of manufacturing same, and piezoelectric and dielectric application components using the same, and more particularly, to a novel piezoelectric single crystal having a perovskite type crystal structure that satisfies the characteristic of an internal bias electric field, $E_i \geq 0.5\text{~}3.0$ kV/cm, essential to a high coercive field electrical stability of the and piezoelectric single crystal simultaneously with maintaining a high dielectric constant and a high piezoelectric charge constant proper to the piezoelectric single crystal through a change in each composition of [A] site ions, [B] site ions and [O] site ions from a perovskite type crystal structure ([A][B]$O_3$), and through a control of oxygen partial pressure at the time of heat treatment in terms of a manufacturing process in order to improve piezoelectric characteristics of the single crystal.

BACKGROUND ART

Since piezoelectric single crystals having a perovskite type crystal structure ([A][B]$O_3$) show an incredibly high dielectric constant $K_3{}^T$ and piezoelectric charge constants $d_{33}$ and $K_{33}$ compared with those shown in existing piezoelectric polycrystal materials, it is expected that the piezoelectric single crystals will be used in high-performance components, like piezoelectric actuators, ultrasonic transducers, piezoelectric sensors, dielectric capacitors, and so on, and their practical application will also lead to substrate materials for various kinds of thin film elements.

Examples of piezoelectric single crystals having the perovskite type crystal structure which have been developed until today include PMN-PT (Pb(Mg$_{1/3}$Nb$_{2/3}$)$O_3$—PbTiO$_3$), PZN-PT (Pb(Zn$_{1/3}$Nb$_{2/3}$)$O_3$—PbTiO$_3$), PINN-PT (Pb(In$_{1/2}$Nb$_{1/2}$)$O_3$—PbTiO$_3$), PYbN-PT (Pb(Yb$_{1/2}$Nb$_{1/2}$)$O_3$—PbTiO$_3$), PSN-PT (Pb(Sc$_{1/2}$Nb$_{1/2}$)$O_3$—PbTiO$_3$), PMN-PInN-PT, PMN-PYbN-PT, BiScO$_3$—PbTiO$_3$ (BS-PT) and so on. Since these single crystals show a congruent melting behavior at the time of melting, they have usually been manufactured by a flux method, a Bridgman method, and so on that are existing single crystal growth methods.

However, although the piezoelectric single crystals of PMN-PT and PZN-PT developed before have the advantage of showing high dielectric and piezoelectric characteristics ($K_3{}^T$>4,000, $d_{33}$>1, 400 pC/N, and $k_{33}$>0.85) at the normal temperature, they are considerably restricted in their utilization due to defects, like low phase transition temperatures $T_C$ and $T_{RT}$, a low coercive filed $E_C$, brittleness, and so on.

In general, piezoelectric single crystals having a perovskite type crystal structure have been well-known as showing the highest dielectric and piezoelectric characteristics from a neighboring boundary with respect to composition in a morphotropic phase boundary (i.e., MPB) between a rhombohedral phase and a tetragonal phase.

However, since the piezoelectric single crystals having the perovskite type crystal structure generally show the best excellent dielectric and piezoelectric characteristics when they have a rhombohedral phase, practical application of the piezoelectric single crystals in the rhombohedral phase has been carried out most actively, but since the piezoelectric single crystals in the rhombohedral phase are stable only at a phase transition temperature $T_{RT}$ or below between the rhombohedral phase and a tetragonal phase, they can be used only at the phase transition temperature $T_{RT}$ or below, the greatest temperature at which the rhombohedral phase is stable. Accordingly, in case that the phase transition temperature $T_{RT}$ is low, a workable temperature for the piezoelectric single crystals in the rhombohedral phase becomes low, and a temperature required for manufacturing components to which the piezoelectric single crystals are applied, and a workable temperature for the application components are also limited to the phase transition temperature $T_{RT}$ or below.

Also, in case that phase transition temperatures $T_C$ and $T_{RT}$, and a coercive field $E_C$ are low, depoling easily occurs from the piezoelectric single crystals under mechanical processing, stress, heat generation, and driving voltage, and the loss of excellent dielectric and piezoelectric characteristics occurs. Accordingly, the piezoelectric single crystals, which show that phase transition temperatures $T_C$ and $T_{RT}$, and a coercive field $E_C$ are low, are restricted in a manufacturing condition of components to which the single crystals are applied, a condition of workable temperatures, a condition of driving voltage, and so on. In case of the single crystal of PMN-PT, a curie temperature Tc, a phase transition temperature $T_{RT}$, and a coercive field $E_C$ generally satisfy $T_C$<150° C., $T_{RT}$<80° C., and $E_C$<2.5 kV/cm, respectively, and in case of the single crystal of PZN-PT, a curie temperature $T_C$, a phase transition temperature $T_{RT}$, and a coercive field $E_C$ generally satisfy $T_C$<170° C., $T_{RT}$<100° C., and $E_C$<3.5 kV/cm, respectively. Furthermore, since dielectric and piezoelectric components manufactured using these piezoelectric single crystals are also restricted in a manufacturing condition, a condition of workable temperature ranges or operational voltage, and so on, this has been an obstacle to the development and the practical use of components to which the piezoelectric single crystals are applied.

In order to overcome the weak points of the piezoelectric single crystals, single crystals of novel composition, like PINN-PT, PSN-PT, BS-PT, and so on, have been developed, and various kinds of single crystal composition in a mixed form, like PMN-PINN-PT, PMN-BS-PT, and so on, have also been studied.

However, in case of these single crystals, it is problematic in that a dielectric constant, a piezoelectric charge constant, phase transition temperatures, a coercive field, and a mechanical characteristic, and so on couldn't be improved simultaneously, and in case of piezoelectric single crystals including costly elements, like Sc, In, and so on, as main ingredients, it is problematic in that the high cost of production for the single crystals is an obstacle to practical use of the single crystals.

The reason why piezoelectric single crystals having a perovskite type crystal structure comprising PMN-PT developed until today show a low phase transition temperature may largely be divided into three points: first, a phase transition temperature of a relaxor (PMN, PZN, or the like) which is a main constituent along with PT is low.

Second, since a morphotropic phase boundary (MPB) at which a tetragonal phase and a rhombohedral phase form the boundary is inclined smoothly rather than being perpendicular to temperature axis, it is necessarily required to decrease a curie temperature $T_C$ in order to raise a phase transition temperature $T_{RT}$ of a rhombohedral phase and a tetragonal phase, so it is difficult to simultaneously raise the curie temperature Tc, and the phase transition temperature $T_{RT}$ of the rhombohedral phase and the tetragonal phase.

Third, even when the relaxor (PYbN, PInN, BiscO3, or the like) having a relatively high phase transition temperature is mixed into PMN-PT, and so on, the phase transition temperature doesn't increase simply in proportion to composition, or the problem of a decline in dielectric and piezoelectric characteristics occurs.

Furthermore, single crystals in relaxor-PT series presented in Non-Patent Document 1 have been manufactured by a flux method, a Bridgman method, and so on which are existing single crystal growth methods, due to a reason related with a manufacturing process of the single crystals, it is difficult to manufacture large single crystals whose composition is uniform, and due to the high cost of production, and difficulty in mass production, the single crystals have not yet succeeded in their commercialization.

Also, although the piezoelectric single crystals generally show a high piezoelectric charge constant ($d_{33} \geq 2,000$~4,000 pC/N) compared with that shown from piezoelectric polycrystal ceramic, depoling occurs easily because a coercive field is low ($E_C \leq 2$ kV/cm), so the piezoelectric single crystals are restricted in their practical use because electrical stability is low. Thus, although a method of enhancing a coercive field of the piezoelectric single crystals has been suggested, it has been pointed out that an increase in the coercive field still lacks effectiveness due to a problem resulting from a decline in piezoelectric characteristics.

Thus, as a result of the present inventors' efforts for improving the conventional problems, the present invention was completed in such a manner as to design a method of maintaining a high piezoelectric characteristic simultaneously with electrical stability of a piezoelectric single crystal by increasing a coercive field and an internal bias electric field appropriately, and to control each change in composition of [A] site ions, [B] site ions and [O] site ions with respect to a perovskite type crystal structure (([A][B]O₃), and oxygen partial pressure at the time of heat treatment t in terms of a manufacturing process, thereby confirming physical properties satisfying the characteristic of a high internal bias electric field $E_I$ essential to electrical stability of the piezoelectric single crystal simultaneously with maintaining a high dielectric constant and a high piezoelectric charge constant proper to the piezoelectric single crystal.

Patent Document 1: Korean Patent No. 0564092 (officially announced on Mar. 27, 2006)

Patent Document 2: Korean Patent No. 0743614 (officially announced on Jul. 30, 2007)

Non-Patent Document 1: IEEE Transactions on Ultrasonics, Ferroelectrics, and Frequency Control, vol. 44, no. 5, 1997, pp. 1140-1147.

DETAILED DESCRIPTION OF THE INVENTION

Technical Problem

An object of the present invention is to provide a piezoelectric single crystal comprising an internal bias electric field.

Another object of the present invention is to provide a method of manufacturing the piezoelectric single crystal.

The other object of the present invention is to provide a piezoelectric component or a dielectric component to which the piezoelectric single crystal is applied.

Solution for Solving the Problem

In order to accomplish the objects as described above, the present invention may provide a piezoelectric single crystal with a perovskite type structure ([A][B]O₃) which satisfies physical properties as follows: (1) a dielectric constant $K_3{}^T$ is 4,000 or more; (2) a piezoelectric charge constant $d_{33}$ is 1,400 pC/N or more; (3) a coercive electric field $E_C$ is 3.5 kV/cm or more; and (4) an internal bias electric field $E_I$ is 0.5 kV/cm or more.

More preferably, the present invention may provide a piezoelectric single crystal with a perovskite type structure ([A][B]O₃) which satisfies physical properties as follows: (1) a dielectric constant is 5,000 or more; (2) a piezoelectric charge constant $d_{33}$ is 1,500 pC/N or more; (3) a coercive electric field $E_C$ is 4.0 kV/cm or more; and (4) an internal bias electric field $E_I$ is 1.0 kV/cm or more.

The piezoelectric single crystal having the perovskite type structure ([A][B]O₃) may be configured in such a manner that each composition of [A] site ions, [B] site ions and [O] site ions is controlled so that the coercive field and the internal bias electric increase, and thus electrical stability of the piezoelectric single crystal, and high piezoelectric characteristics are maintained.

Thus, a piezoelectric single crystal represented by a compositional formula of Chemical Formula 1 having the perovskite type structure ([A][B]O₃) below may be provided:

$$[A_{1-(a+1.5b)}B_aC_p][(MN)_{1-x-y}(L)_yTi_x]O_{3-z} \qquad \text{Chemical Formula 1}$$

in said formula,

A represents Pb or Ba,

B represents at least one or more elements selected from a group consisting of Ba, Ca, Co, Fe, Ni, Sn, and Sr, C represents one or more elements selected from a group consisting of Co, Fe, Bi, La, Ce, Pr, Nd, Pm, Sm, Eu, Gd, Tb, Dy, Ho, Er, Tm, Yb, and Lu, L represents a single form composed of one selected from Zr or Hf, or a mixed form thereof, M represents at least one or more elements selected from a group consisting of Ce, Co, Fe, In, Mg, Mn, Ni, Sc, Yb, and Zn, N represents at least one or more elements selected from a group consisting of Nb, Sb, Ta, and W, and a, b, X, Y, and z represent $0<a\leq0.10$, $0<b\geq0.05$, $0.05\leq x\leq0.58$, $0.05\leq y\leq0.62$, and $0\leq z\leq0.02$, respectively.

When L represents a mixed form, the piezoelectric single crystal represented by a compositional formula of Chemical Formula 2 below may be provided:

$$[A_{1-(a+1.5b)}B_aC_b][(MN)_{1-x-y}(Zr_{1-w}Hf_w)_yTi_x]O_{3-z} \qquad \text{Chemical Formula 2}$$

where A, B, C, M, and N are the same as those presented in Chemical Formula 1, and a, b, x, and y are also the same as those presented in Chemical Formula 1, but w represents $0.01\leq w\leq0.20$.

The piezoelectric single crystal represented by the compositional formula of Chemical Formula 1 according to the present invention may be based on composition which satisfies $0.01\leq a\leq0.10$ and $0.01\leq b\leq0.05$, more preferably, satisfying a/b≥2 from said formulae.

The piezoelectric single crystal represented by the compositional formula of Chemical Formula 1 according to the present invention may be based on composition which satisfies $0.10\leq x\leq0.58$ and $0.10\leq y\leq0.62$.

With respect to the piezoelectric single crystal represented by the compositional formula of Chemical Formula 1 or Chemical Formula 2 according to the present invention, it may be preferable that a porosity inside of the single crystal is 0.5 vol % or more.

Also, the piezoelectric single crystal represented by the compositional formula of Chemical Formula 1 according to the present invention may show that a composition gradient inside of the single crystal is formed in a range of 0.2 to 0.5 mol %.

With respect to the piezoelectric single crystal, said x and y may belong into a range of within 10 mol % from composition of a morphotropic phase boundary between a rhombohedral phase and a tetragonal phase, more preferable, said x and y may belong into a range of within 5 mol % from the composition of the morphotropic phase boundary between the rhombohedral phase and the tetragonal phase.

The piezoelectric single crystal may show that a curie temperature $T_c$ is 180° C. or more, and at the same time as this, a phase transition temperature $T_{RT}$ between the rhombohedral phase and the tetragonal phase is 100° C. or more.

Also, the piezoelectric single crystal may satisfy that a longitudinal electromechanical coupling coefficient $k_{33}$ is 0.85 or more, and a coercive electric field $E_c$ is 3.5 to 12 kV/cm. The present invention may provide a method of manufacturing the piezoelectric single crystal, comprising of: Step (a) reducing number density of abnormal grains (i.e., the number of abnormal grains/unit area) by adjusting an average size of matrix grains (matrix grains) of a polycrystal having composition which constitutes the piezoelectric single crystal; Step (b) growing the abnormal grains by heat-treating the polycrystal which shows that the number density of the abnormal grains obtained through said Step (a) decreases, wherein a power molding substance is obtained in such a manner as to calcine powder based on the composition constituting the piezoelectric single crystal at a temperature of less than 800 to 900° C., and a first heat treatment process of sintering the powder molding substance, and a second heat treatment process required at the time of growth of the single crystal are carried out.

According to the manufacturing method of the piezoelectric single crystal, with respect to the piezoelectric single crystal having the perovskite type crystal structure ([A][B] $O_3$), as each composition of [A] site ions and [B] site ions is controlled, a high dielectric constant, a high piezoelectric charge constant, and a high coercive field proper to the piezoelectric single crystal are maintained, and at the same time, an internal bias electric field $E_I$ which doesn't exist in a general PMN-PT single crystal can be induced sufficiently largely, so novel piezoelectric single crystals having large resistance to external circumstances may be provided.

Furthermore, the present invention may provide a piezoelectric body composed of the piezoelectric single crystal having the excellent characteristics, or a piezoelectric in which the piezoelectric single crystal and a polymer are mixed.

Also, a piezoelectric application component and a dielectric application component using the piezoelectric body may be provided.

To one example of the piezoelectric application component and the dielectric application component may be applied any one selected from a group consisting of ultrasonic transducers, piezoelectric actuators, piezoelectric sensors, dielectric capacitors, electric field-generating transducers, and electric field and vibration-generating transducers.

Effect of the Invention

A piezoelectric single crystal, and a piezoelectric application components to which the piezoelectric single crystal is applied according to the present invention have the advantage of being useful in a wide temperature range, and a condition of operational voltage because they have the characteristic of a high internal bias electric field ($E_I \geq 0.5$~3.0 kV/cm) "essential to electrical stability of the piezoelectric single crystal" as well as showing excellent physical properties: a dielectric constant $K_3^T$ is 4,000 or more, a piezoelectric charge constant $d_{33}$ is 1,400 pC/N or more, and a coercive field $E_C$ is 3.5 kV/cm or more.

Also, the piezoelectric single crystals can be manufactured using a solid phase single crystal growth method which is suitable for mass production of the single crystals, and commercialization of the piezoelectric single crystals can be realized by the development of single crystal composition in which a costly raw material is not included.

Furthermore, the piezoelectric single crystal, and components to which the piezoelectric single crystal is applied according to the present invention enable piezoelectric and dielectric application components using the piezoelectric single crystal having excellent characteristics to be manufactured and used in a wide temperature range.

BRIEF DESCRIPTION OF THE DRAWINGS

FIG. 10 is a graph showing each change in polarization to electric field concerning a piezoelectric single crystal of

7

Figure 1:
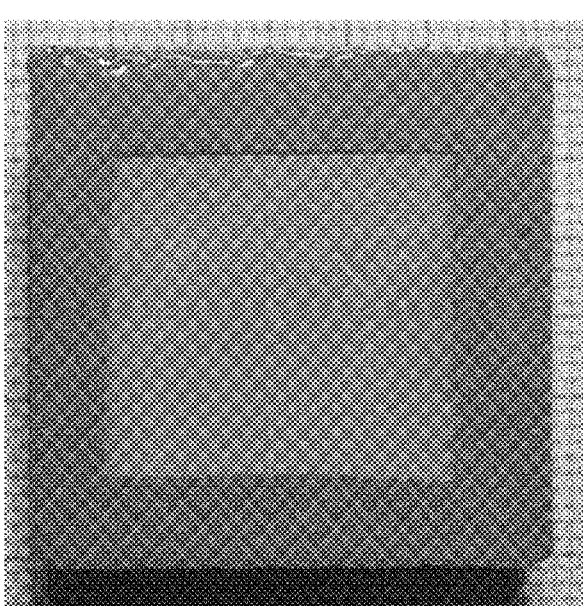
FIG. 1 shows a piezoelectric single crystal of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ according to a first exemplary embodiment of the present invention.

$[Pb_{0.98-1.5x}Sr_{0.02}Sm_x][(Mg_{1/3}Nb_{2/3})_{0.35}Zr_{0.30}Ti_{0.35}]O_{3-z}$ (x=0.01; z=0.0, Comparative Example 6) and a piezoelectric single crystal satisfying x=0.01; z=0.02 (Example 4-5) among piezoelectric single crystals according to the second exemplary embodiment of the present invention, and a general PMN-30 PT piezoelectric single crystal.

BEST MODE FOR CARRYING OUT THE INVENTION

Hereinafter, the present invention is described in detail.

The present invention provides a piezoelectric single crystal that keeps up a high h piezoelectric characteristic simultaneously with electrical stability of the piezoelectric single crystal in such a manner as to increase a coercive electric field and an internal bias electric field.

The present invention provides a piezoelectric signal crystal having a perovskite type structure ($[A][B]O_3$) comprising an internal bias electric field, which satisfies physical properties: (1) a dielectric constant $K_3^T$ is 4,000 or more; (2) a piezoelectric charge constant $d_{33}$ is 1,400 pC/N or more; (3) a coercive electric field $E_c$ is 3.5 kV/cm or more; and (4) an internal bias electric field $E_I$ is 0.5 kV/cm or more.

More preferably, the present invention provides a piezoelectric signal crystal having a perovskite type structure ($[A][B]O_3$), which satisfies the following physical properties: (1) a dielectric constant $K_3^T$ is 5,000 or more; (2) a piezoelectric charge constant $d_{33}$ is 1,500 pC/N or more; (3) a coercive electric field $E_C$ is 4.0 kV/cm or more; and (4) an internal bias electric field $E_I$ is 1.0 kV/cm or more.

Specifically, the piezoelectric single crystal satisfies the following: (1) a dielectric constant $K_3^T$ is 4,000 to 15,000; (2) a piezoelectric charge constant $d_{33}$ is 1,400 to 6,000 pC/N; (3) a coercive electric field $E_c$ is 3.5 to 12 kV/cm; and (4) an internal bias electric field $E_I$ is 0.5 to 3.0 kV/cm.

Also, the piezoelectric single crystal of the present invention is characteristic in that the physical properties presented in said (1) to (4) are maintained at a temperature of 20 to 80° C.

Values of the dielectric constant and the piezoelectric charge constant may be evaluated under a condition of the same temperatures at the normal temperature, and unless the context in the specification of the present invention specially indicates otherwise, the values mean values of the dielectric constant and the piezoelectric charge constant evaluated at 30° C.

The piezoelectric single crystal of the perovskite type structure ($[A][B]O_3$) shows that each composition of [A] site ions, [B] site ions and [O] site ions is controlled so that a coercive electric field and an internal bias electric field increase, and thus electrical stability and a high piezoelectric characteristic of the piezoelectric single crystal are maintained.

Thus, the present invention provides a piezoelectric single crystal having a perovskite type structure ($[A][B]O_3$) represented by a compositional formula of Chemical Formula 1 below:

$$[A_{1-(a+1.5b)}B_aC_p][(MN)_{1-x-y}(L)_yTi_x]O_{3-z} \qquad \text{Chemical Formula 1}$$

in said formula,

A represents Pb or Ba,

B represents at least one or more elements selected from a group consisting of Ba, Ca, Co, Fe, Ni, Sn, and Sr, C represents one or more elements selected from a group consisting of Co, Fe, Bi, La, Ce, Pr, Nd, Pm, Sm, Eu, Gd, Tb, Dy, Ho, Er, Tm, Yb, and Lu,

8

L represents a single form composed of one selected from Zr or Hf, or a mixed form thereof, M represents at least one or more elements selected from a group consisting of Ce, Co, Fe, In, Mg, Mn, Ni, Sc, Yb, and Zn, N represents at least one or more elements selected from a group consisting of Nb, Sb, Ta, and W, a, b, x, y, and Z represent $0<a≤0.10$, $0<b≤0.05$, $0.05≤x≤0.58$, $0.05≤y≤0.62$, and $0≤z≤0.02$, respectively.

Based on the fact that a piezoelectric characteristic of the piezoelectric single crystal having the compositional formula of Chemical Formula 1 of the present invention tends to increase more as chemical composition becomes complicated, the [A] site ions from the perovskite type crystal structure ($[A][B]O_3$) are configured in complex composition.

At this time, specifically reviewing complex composition of the [A] site ions from the piezoelectric crystal represented by the compositional formula of Chemical Formula 1, the complex composition may be configured into $[A_{1-(a+1.5b)}B_aC_b]$, and composition of said A includes a flexible or inflexible element, and in the examples of the present invention, although A is described as being limited to Pb, a piezoelectric single crystal in flexible series, it should not be limited thereto.

With respect to the ion located at said [A], a divalent metal, preferably, at least one or more elements selected from a group consisting of Ba, Ca, Co, Fe, Ni, Sn, and Sr, is used in the composition of B, and a trivalent metal is used in the composition of C.

Preferably, one or more elements selected from a group consisting of Co, Fe, Bi, La, Ce, Pr, Nd, Pm, Sm, Eu, Gd, Tb, Dy, Ho, Er, Tm, Yb, and Lu are used, and more preferably, a single form composed of one selected from elements in lanthanide series, or a mixed form thereof is used.

In the exemplary embodiments of the present invention, with respect to the ion located at [A], although the composition of C is described as being used into composition in single form including La or Sm, or composition in a mixed form including both the elements, it should not be limited thereto.

With respect to the complex composition of the [A] site ions from the piezoelectric single crystal represented by the compositional formula of said Chemical Formula 1, composition of $[A_{1-(a+1.5b)}B_aC_b]$ corresponding to the [A] site ions are a requisite for embodying a target physical property, and is characterized by being configured through mixing a divalent metal and a trivalent metal when A is a piezoelectric single crystal in flexible series or inflexible series.

Preferably, with respect to the complex composition of the [A] site ions corresponding to a donor from the composition of the piezoelectric single crystal represented by Chemical Formula 1, it should satisfy $0.01≤a≤0.10$ and $0.01≤b≤0.05$, more preferably, a/b>2. At this time, in said requites, when a is less than 0.01, it is problematic in that a perovskite phase is unstable, and when a exceeds 0.10, it is not preferable in that practical use becomes difficult because a phase transition temperature gets too low.

Furthermore, when the requisite of $a/b≥2$ is not satisfied, it is not preferable in that dielectric and piezoelectric characteristics aren't maximized, or growth of the single crystal is limited.

At this time, with respect to the complex composition of the [A] site ions from the composition of the piezoelectric single crystal represented by Chemical Formula 1, as compared with composition formed of a trivalent metal or a divalent metal alone, the complex composition enables an excellent dielectric constant to be realized.

According to a state diagram of [A] [MN]O$_3$—PbTiO$_3$—PbZrO$_3$ known generally, a compositional area showing excellent dielectric and piezoelectric characteristics is revealed from the surroundings of a morphotropic phase boundary (MPB) between a rhombohedral phase and a tetragonal phase. In the state diagram of [A] [MN]O$_3$—PbTiO$_3$—PbZrO$_3$, the dielectric and piezoelectric characteristics are maximized at composition in the morphotropic phase boundary (MPB) between the rhombohedral phase and the tetragonal phase, and as composition gradually goes away from the composition in the MPB, the dielectric and piezoelectric characteristics also decrease gradually. Furthermore, in case of within 5 mol % of composition in an area of the rhombohedral phase from the composition in the MPB, since a decrease in dielectric and piezoelectric characteristics is small, very high dielectric and piezoelectric characteristic values are maintained, and in case of within 10 mol % of composition in the area of the tetragonal phase from the composition in the MPB, the dielectric and piezoelectric characteristics decrease consecutively, but values of the dielectric and piezoelectric characteristics show to be sufficient high to be applied to dielectric and piezoelectric application components. In case that the composition changes from the composition in the MPB to composition in an area of the tetragonal phase, a decrease in dielectric and piezoelectric characteristics occurs more rapidly than in the area of the rhombohedral phase. However, even in case of within 10 mol % of the composition as well as in case of within 5 mol % of the composition in the area of the tetragonal phase, the dielectric and piezoelectric characteristics decrease, but the values of the dielectric and piezoelectric characteristics show to be sufficient high to be applied to dielectric and piezoelectric application components.

The morphotropic phase boundary (MPB) between PbTiO$_3$ and PbZrO$_3$ has been well-known as PbTiO$_3$:PbZrO$_3$=x:y=0.48:0.52 (a molar ratio).

In casa that 5 mol % of the composition changes from the composition in the MPB to composition in each area of the rhombohedral phase and the tetragonal phase, the maximum value of x and the maximum value of y become 0.53 and 0.57, respectively (in other words, when x is the maximum value, x:y represents 0.53:0.47, and when y is the maximum value, x:y represents 0.43:0.57). Furthermore, in casa that 10 mol % of the composition changes from the composition in the MPB to composition in each area of the rhombohedral phase and the tetragonal phase, the maximum value of x and the maximum value of y become 0.58 and 0.62, respectively (in other words, when x is the maximum value, x:y represents 0.58:0.42, and when y is the maximum value, x:y represents 0.38:0.62). High dielectric and piezoelectric characteristic values are maintained in the range of within 5 mol % of the composition which reaches the composition in each area of the rhombohedral phase and the tetragonal phase from the composition in the MPB, and sufficient high dielectric and piezoelectric characteristic values to be applied to dielectric and piezoelectric application components are shown in the range of within 10 mol % of the composition which reaches the composition in each area of the rhombohedral phase and the tetragonal phase from the composition in the MPB.

Also, in case that contents of PbTiO$_3$ and PbZrO$_3$, namely, the values of x and y are 0.05 or below, since the morphotropic phase boundary between the rhombohedral phase and the tetragonal phase may not be made, or phase transition temperatures and a coercive field are too low, they are not suitable for the present invention.

Accordingly, with respect to complex composition of the ion located at [B] corresponding to an acceptor from composition of the piezoelectric single crystal represented by the compositional formula of said Chemical Formula 1, it is preferable that X falls into a range of 0.05≤x≤0.58, more preferably, 0.10≤x≤0.58. At this time, that is because phase transition temperatures T$_C$ and TRT are low, piezoelectric charge constants d$_{33}$ and k$_{33}$ are low, or a coercive electric field E$_c$ is low in case that x is less than 0.5, and because a dielectric constant K3T is low, piezoelectric charge constants d$_{33}$ and k$_{33}$ are low, or a phase transition temperature T$_{RT}$ is low in case that x exceeds 0.58. Meanwhile, it is preferable that y falls into a range of 0.05≤y≤0.62, more preferably, satisfying 0.10≤y≤0.62. That is because phase transition temperatures Tc and TRT are low, and piezoelectric charge constants d$_{33}$ and k$_{33}$ are low, or a coercive electric field E$_c$ is low in case that y is less than 0.05, and a dielectric constant K$_3{}^T$ is low, or piezoelectric charge constants d$_{33}$ and k$_{33}$ are low in case that y exceeds 0.62.

The piezoelectric single crystal represented by the compositional formula of Chemical Formula 1 according to the present invention includes a tetravalent metal in the ion located at [B] from the perovskite type crystal structure ([A][B]O$_3$), and particularly, a form of the composition of L is limited to a single form composed of one selected from Zr or Hf, or a mixed form thereof.

When the composition has the mixed form, a piezoelectric single crystal represented by a compositional formula of Chemical Formula 2 below is provided.

$$[A_{1-(a+1.5b)}B_aC_b][(MN)_{1-x-y}(Zr_{1-w}Hf_w)_y Ti_x]O_{3-z} \qquad \text{Chemical Formula 2}$$

In said formulae, A, B, C, M, and N are identical with those shown in said Chemical Formula 1, and a, b, x, y and z are also identical with those shown in these formulae, but w represents 0.01≤w≤0.20.

At this time, when said w is less than 0.01, it is problematic in that dielectric and piezoelectric characteristics aren't maximized, and when it exceeds 0.20, it is not preferable in that dielectric and piezoelectric characteristics decrease suddenly.

With respect to the piezoelectric single crystal of the present invention, the exemplary embodiment is described in detail on the basis of a piezoelectric single crystal below:

PART 1 the first exemplary embodiment [Pb$_{1-(a+1.5b)}$Sr$_a$C$_b$][(MN)$_{1-x-y}$(Zr)$_y$Ti$_x$]O$_3$ PART 2 the second exemplary embodiment [Pb$_{1-(a+1.5b)}$Sr$_a$C$_b$][(MN)$_{1-x-y}$(Zr)$_y$Ti$_x$]O$_{3-a}$ in said formula, C represents one or more elements selected from a group consisting of Co, Fe, Bi, La, Ce, Pr, Nd, Pm, Sm, Eu, Gd, Tb, Dy, Ho, Er, Tm, Yb, and, Lu, M represents at least one or more elements selected from a group consisting of Ce, Co, Fe, In, Mg, Mn, Ni, Sc, Yb, and Zn, N represents at least one or more elements selected from a group consisting of Nb, Sb, Ta, and W, and a, b, x, and y represent 0.02≤a≤0.10, 0.005≤b≤0.05, 0.35≤x≤0.58, 0.05≤y≤0.62 and 0<z≤0.02 respectively.

As a result with respect to the composition of the piezoelectric single crystal, although it is described that a coercive electric field and an internal bias electric field increase effectively while a high dielectric constant, a high piezoelectric charge constant, and a high coercive electric field which are proper to the piezoelectric single are maintained by a restriction on the compositional ratio of a donor and an acceptor, the composition, and the compositional ratio aren't limited thereto, and various variations and modifications may be made within the compositional scope of Chemical Formula 1.

Figure 2:
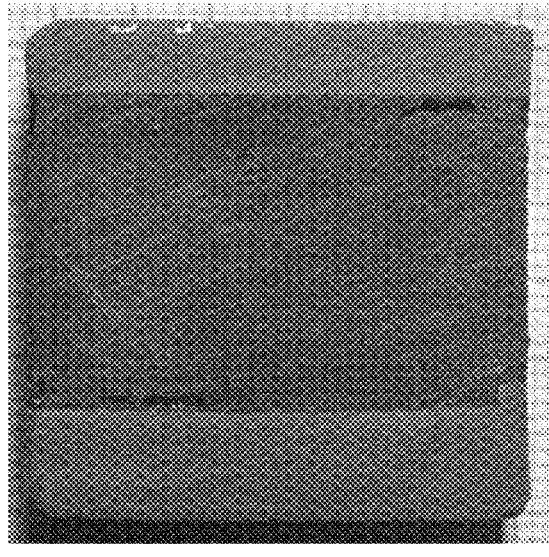
FIG. 2 shows a piezoelectric single crystal [a single crystal growth atmosphere (air); black-colored by the addition of Mn] of $[Pb_{0.98-1.5x}Sr_{0.02}La_x][(Mg_{1/3} Nb_{2/3})_{0.4-y}(Mn_{1/3} Nb_{2/3})_y Zr_{0.25}Ti_{0.35}]O_3$ (x=0.01; y=0.05, Example 1-3) according to the first exemplary embodiment of the present invention.
Figure 3:
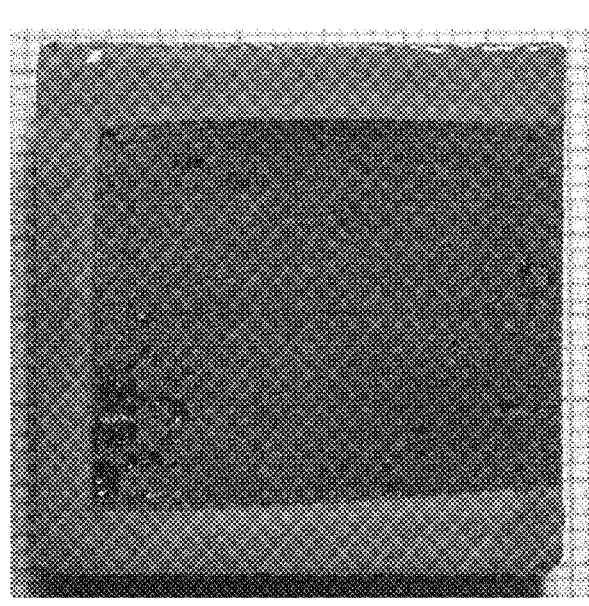
FIG. 3 shows a piezoelectric single crystal [a single crystal growth atmosphere (N2-H2); black-colored by the addition of Mn] of $[Pb_{0.98-1.5x}Sr_{0.02}La_x][(Mg_{1/3}Nb_{2/3})_{0.4-y} (Mn_{1/3}Nb_{2/3})_y Zr_{0.25}Ti_{0.35}]O_3$ (x=0.01; y=0.05, Example 1-3) according to the first exemplary embodiment of the present invention.

FIG. 1 to FIG. 3 are photos showing the piezoelectric single crystal with the perovskite type structure manufactured according to the first exemplary embodiment of the present invention, and it may be confirmed that an external appearance of the single crystal becomes different according to a change in compositional ratio of the donor and the acceptor, and an atmosphere at the time of growth of the single crystal.

Figure 4:
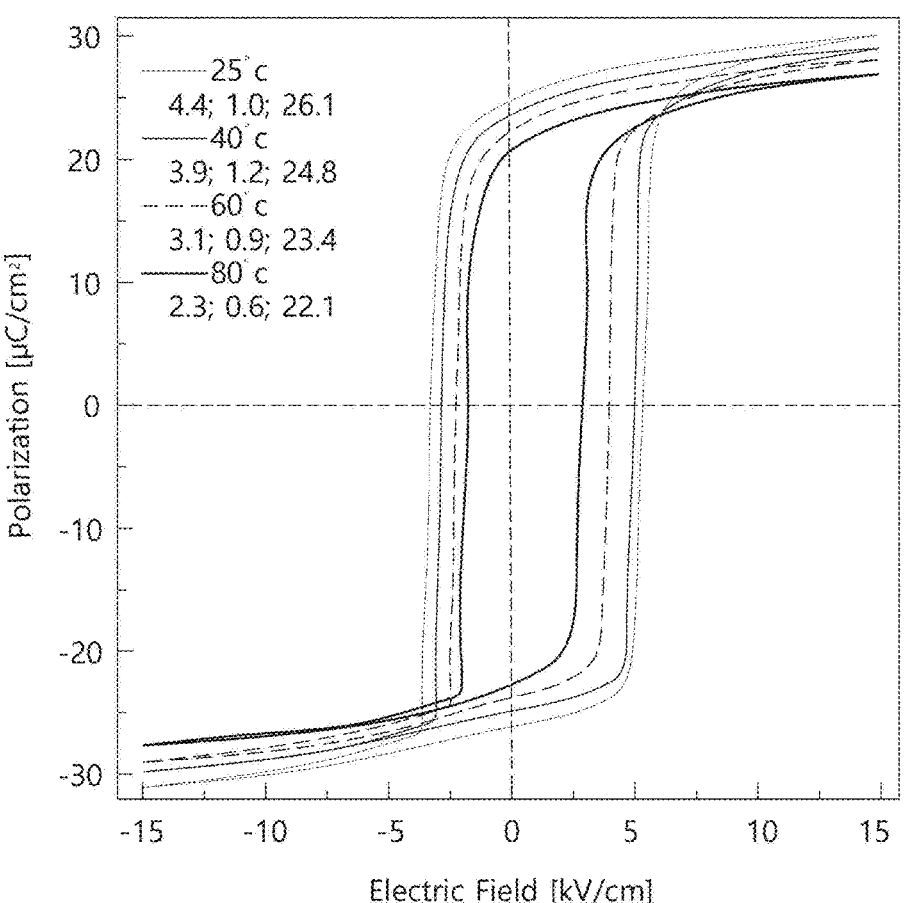
FIG. 4 shows a polarization to electric field graph concerning the piezoelectric single crystal [the single crystal growth atmosphere (air)] of $[Pb_{0.98-1.5x}Sr_{0.02}La_x][(Mg_{1/3} Nb_{2/3})_{0.4-y}(Mn_{1/3}Nb_{2/3})_y Zr_{0.25}Ti_{0.35}]O_3$ (x=0.01; y=0.05, Example 1-3) according to the first exemplary embodiment of the present invention.
Figure 5:
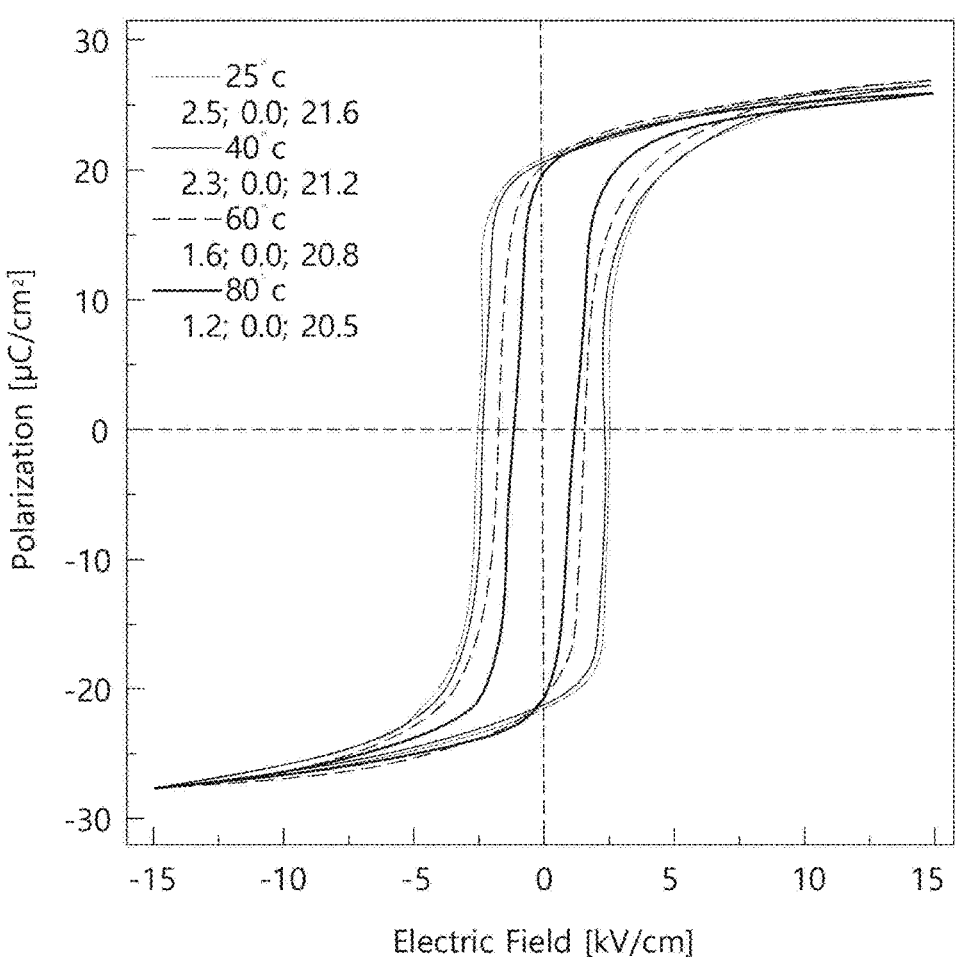
FIG. 5 shows a polarization to electric field graph concerning a general PMN-30 PT piezoelectric single crystal [a single crystal growth atmosphere (air)] manufactured by a solid phase single crystal growth method.
Figure 6:
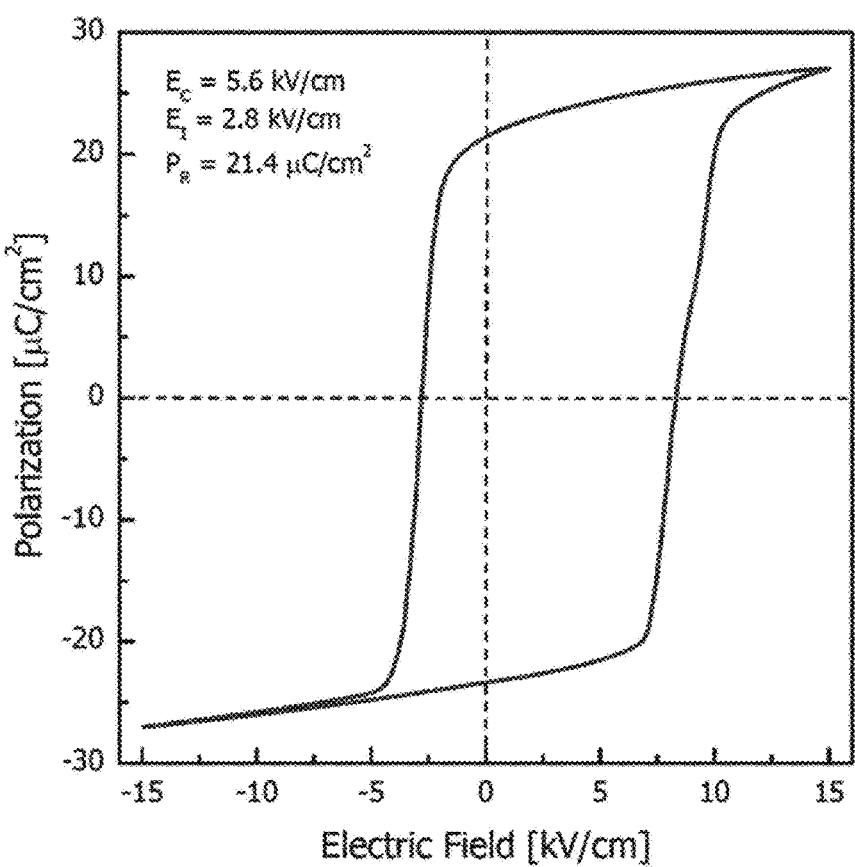
FIG. 6 shows a polarization to electric field graph concerning a piezoelectric single crystal [a single crystal growth atmosphere (N2-H2)] of $[Pb_{0.98-1.5x}Sr_{0.02}La_x][(Mg_{1/3} Nb_{2/3})_{0.4-y}(Mn_{1/3}Nb_{2/3})_y Zr_{0.25}Ti_{0.35}]O_3$ (x=0.01; y=0.05, Example 1-4) according to the first exemplary embodiment of the present invention.

Also, as illustrated in FIG. 4 to FIG. 6, with respect to the composition of the piezoelectric single crystal according to the first exemplary embodiment, as a donor content and an acceptor content, preferably, a Mn content, are adjusted to be most suitable, a coercive electric field and an internal bias electric field increase effectively, so stability of the piezoelectric signal crystal increases at the time of driving of the electric field, and under the condition of mechanical load.

Figure 7:
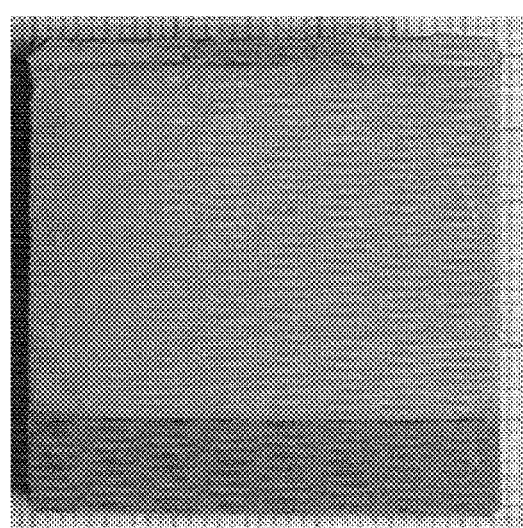
FIG. 7 shows a piezoelectric single crystal of $[Pb_{0.98-1.5x}Sr_{0.02}Sm_x][(Mg_{1/3}Nb_{2/3})_{0.35}Zr_{0.30}Ti_{0.35}]O_{3-z}$ (x=0.01; z=0.0, Comparative Example 5) according to a second exemplary embodiment of the present invention.
Figure 8:
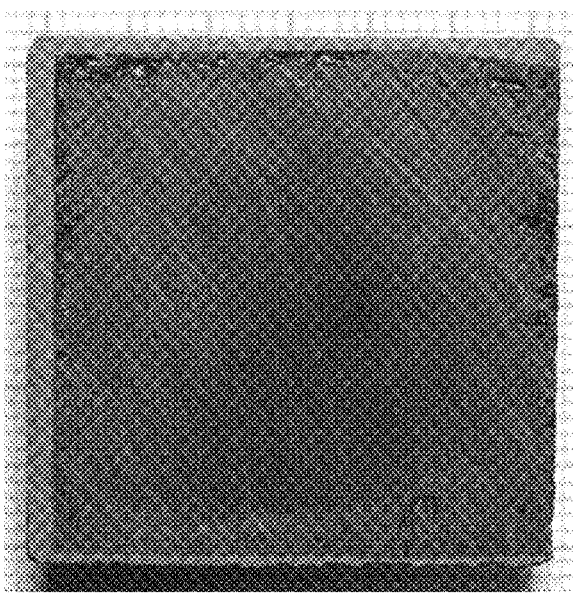
FIG. 8 shows a piezoelectric single crystal of $[Pb_{0.98-1.5x}Sr_{0.02}Sm_x][(Mg_{1/3}Nb_{2/3})_{0.35}Zr_{0.30}Ti_{0.35}]O_{3-z}$ (x=0.01; z=0.005, Example 3-3) according to the second exemplary embodiment of the present invention.
Figure 9:
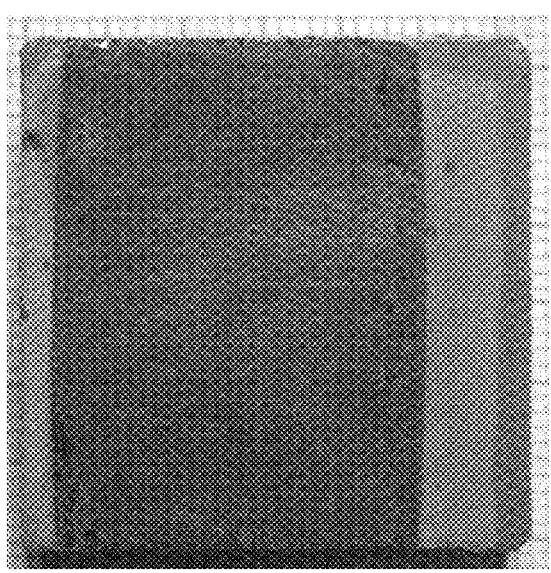
FIG. 9 shows a piezoelectric single crystal of $[Pb_{0.98-1.5x} Sr_{0.02}Sm_x][(Mg_{1/3}Nb_{2/3})_{0.35}Zr_{0.30}Ti_{0.35}]O_{3-z}$ (x=0.01; z=0.01, Example 3-4) according to the second exemplary embodiment of the present invention.

Also, FIG. 7 to FIG. 9 present each external appearance of the single crystal which becomes different according to control of the donor, and oxygen vacancy located at [O] from the piezoelectric single crystal having the perovskite type crystal structure ($[A][B]O_3$) according to the second exemplary embodiment of the present invention.

At this time, with respect to the piezoelectric single crystal according to the second exemplary embodiment, it is characteristic in that the oxygen vacancy located at [O] is controlled to $0 \leq z \leq 0.02$. When said z exceeds 0.02, it is not preferable in that dielectric and piezoelectric characteristics decrease suddenly.

Figure 10:
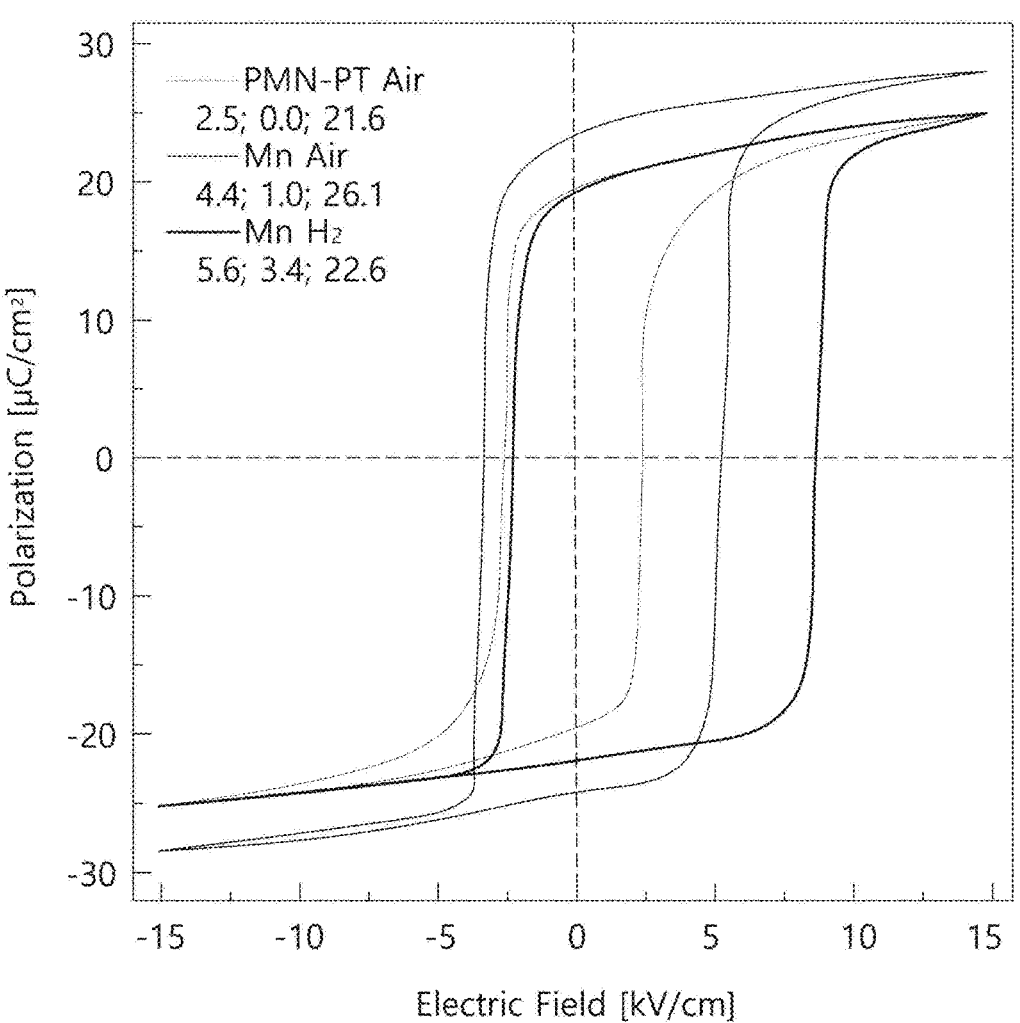

When the oxygen vacancy is induced into the range, as illustrated in FIG. 10, the coercive electric field, and the internal bias electric field increase effectively, so stability of the piezoelectric single crystal increases at the time of driving of the electric field, and under the condition of mechanical load. Accordingly, the piezoelectric characteristic may be maximized, and stability may also be enhanced.

The piezoelectric single crystal represented by the compositional formula of said Chemical Formula 1 is a piezoelectric single crystal in which complex composition of the [A] site ions are mixed with composition of the ion located at [B] and the ion located at [O] from the perovskite type crystal structure ($[A][B]O_3$) so that a curie temperature Tc is 180° C. or more, and as the same time, a phase transition temperature $T_{RT}$ between the rhombohedral phase and the tetragonal phase is 100° C. At this time, when the curie temperature $T_c$ is less than 180° C., this is problematic in that it is difficult to raise the coercive electric field $E_C$ to 5 kV/cm or more, or the phase transition temperature $T_{RT}$ to 100° C. or more.

Also, the piezoelectric single crystal represented by the compositional formula of said Chemical Formula 1 according to the present invention shows that a longitudinal electromechanical coupling coefficient k33 is 0.85 or more, and when the longitudinal electromechanical coupling coefficient is less than 0.85, this is not preferable in that the characteristic becomes similar to that of piezoelectric polycrystal ceramics, and energy conversion efficiency gets low.

Also, with respect to the piezoelectric single crystal represented by the compositional formula of said Chemical Formula 1 according to the present invention, a composition gradient inside of the single crystal is formed in a range of 0.2 to 0.5 mol % so that the single crystal having uniformity can be provided.

Since lead zirconate ($PbZrO_3$) has a high phase transition temperature of 230° C., and also is effective to cause a morphotropic phase boundary (MPB) to be more perpendicular to a temperature axis, it is possible to obtain a high phase transition temperature TRT between the rhombohedral phase and the tetragonal phase while keeping up a high curie temperature, and composition which shows that the curie temperature T. and the phase transition temperature $T_{RT}$ are high simultaneously may also be developed.

That is because the phase transition temperature increases in proportion to a content of the lead zirconate even when the lead zirconate is mixed into conventional piezoelectric single crystal composition. Accordingly, the piezoelectric single crystal with the perovskite type crystal structure comprising zirconium (Zr) or lead zirconate may overcome the problems of existing piezoelectric single crystals. Furthermore, since zirconia ($ZrO_2$) or lead zirconate has been used in main ingredients from existing materials for piezoelectric single crystals, and it is also a low-priced material, the objects of the present invention may be accomplished without raising a material price of the single crystal.

On the contrary, unlike PMN-PT, PZN-PT, and so on, the perovskite type piezoelectric single crystal comprising lead zirconate shows an incongruent-melting behavior rather than showing a congruent-melting behavior at the time of melting. Accordingly, in case that the incongruent-melting behavior is shown, the lead zirconate is divided into liquid phase zirconia and solid phase zirconia ($ZrO_2$) at the time of melting of a solid phase, and solid phase zirconia particles within a liquid phase disturb growth of the single crystal, so the piezoelectric single crystal may not be manufactured using only a flux method, Bridgman method, and so on which are general single crystal growth methods using a melting process.

Also, it is difficult to manufacture a single crystal comprising a reinforced second phase through the general single crystal growth methods using a melting process, and it has never been reported to manufacture the single crystal. That is because a reinforced second phase chemically reacts to a liquid phase due to its instability at a melting temperature or more, and is thus removed without being maintained in an individual second phase form. Also, since a separation between the second phase and the liquid phase occurs due to a difference in density between the second phase within the liquid phase, and the liquid phase, it is difficult to manufacture a single crystal comprising the second phase, and it also is impossible to adjust volume fraction, a size, a shape, arrangement, distribution, and so on of the reinforced second phase inside of the single crystal.

Thus, according to the present invention, piezoelectric single crystals comprising a reinforced second phase are manufactured using a solid phase single crystal growth method in which no melting process is used. In the solid phase single crystal growth method, single crystal growth occurs at a melting temperature or below, so a chemical reaction between the reinforced second phase and the single crystal is controlled, and the reinforced second phase becomes to exist stably in an individual form inside of the single crystal.

Also, single crystal growth occurs from a polycrystal comprising the reinforced second phase, and there is no change in the volume fraction, size, shape, arrangement, distribution, and so on of the reinforced second phase during the single crystal growth. Accordingly, when the volume fraction, size, shape, arrangement, distribution, and so on of the reinforced second phase inside of the polycrystal are controlled in a process of making the polycrystal comprising the reinforced second phase, and single crystals are grown, as a result thereof, the single crystals comprising the reinforced second phase in a desired form, namely, reinforced piezoelectric single crystals (second phase-reinforced be single crystals) may manufactured.

When the flux method and the Bridgman method which are conventional single methods crystal growth are used, piezoelectric single crystals may not be manufactured in complex composition with respect to the perovskite type crystal structure ($[A][B]O_3$). In particular, in case of the flux method and the Bridgman method including the melting process, single crystals may be manufactured in such a manner that a composition gradient inside of the single crystals is 1 to 5 mol % or more, whereas in case of the solid phase single crystal growth method according to the present invention, single crystals may be manufactured in uniform composition in which a composition gradient inside of the single crystals is 0.2 to 0.5 mol %.

Accordingly, in the present invention, with respect to the perovskite type crystal structure ($[A][B]O_3$) comprising lead zirconate using the solid phase single crystal growth method, even when mixing of the complex composition of the [A] site ions, and composition of the [B] site ions forms complicated composition, piezoelectric single crystals grow uniformly, so novel piezoelectric single crystals showing a dielectric constant ($K_3^T \geq 4,000$ to $15,000$), a piezoelectric charge constant ($d_{33} \geq 1,400$ to $6,000$ pC/N), and a high coercive electric field ($E_c \geq 3.5$ to $12$ kV/cm) which are remarkably enhanced in comparison with conventional piezoelectric single crystals can be provided.

In particular, the coercive field $E_c$ is 3.5 kV/cm or more, more preferably, 4 to 12 kV/cm, and when the coercive field is less than 3.5 kV/cm, it is problematic in that poling is easily removed at the time of processing of the piezoelectric single crystals, or at the time of manufacturing or using components to which piezoelectric single crystals are applied.

Also, since a high internal bias electric field $E_I$ essential to electrical stability of the piezoelectric single crystals is 0.5 kV/cm or more, more preferably, 0.5 to 3.0 kV/cm, thereby having the characteristics simultaneously, it has the advantage of being useful in a wide temperature range, and a condition of operational voltage.

The present invention provides a method of manufacturing a piezoelectric single crystal using a solid phase single crystal growth method. The solid phase single crystal growth method is based on Patent Documents 1 and 2, and the piezoelectric single crystal grown by the solid phase single crystal growth method may be produced in large quantities at low process prices compared with that grown by a flux method and a Bridgman method.

Specifically, the manufacturing method of the piezoelectric single crystal according to the present invention comprises of: Step (a) reducing the number density of abnormal grains (i.e., the number of abnormal grains/unit area) by adjusting an average size of matrix grains of a polycrystal having composition which constitutes the piezoelectric single crystal; and Step (b) growing the abnormal grains by thermally treating the polycrystal showing a decrease in the number density of the abnormal grains obtained through said Step (a), wherein calcining the powder of the composition constituting the piezoelectric single crystal at a temperature of less than 800 to 900° C. to obtain a power molding substance, and performing a first heat treatment process for sintering the powder molding substance and a secondary heat treatment process for growing single crystal growth.

Furthermore, with respect to another manufacturing method, a method of manufacturing a piezoelectric single crystal, which is carried out in such a manner as to treat a polycrystal under the condition that the number density of abnormal grains decreases as an average size of matrix grains of the polycrystal having the composition is adjusted, is provided.

In the above fact, the single crystal may be obtained in such a manner as to continuously grow only a small number of abnormal grains occurring in a state in which the number density of the abnormal grains of the polycrystal decreases.

The manufacturing method of the piezoelectric single crystal may be provided in such a manner as to continuously grow a seed single crystal inside of the polycrystal during heat treatment by uniting the seed single crystal to the polycrystal before the heat treatment of the polycrystal.

The average size R of the matrix grains of the polycrystal is adjusted into within a size range which reaches 0.5 to 2 times ($0.5R_c \leq R \leq 2R_c$) with respect to a critical size (an average size $R_c$ of the matrix grains showing that the number density of abnormal grains becomes "0 (zero)"). At this time, in case that the average size of the matrix grains of the polycrystal is smaller than 0.5 $R_c$ ($0.5R_c > R$), since the number density of the abnormal grains is too high, no single crystal grows, and in case that the average size of the matrix grains of the polycrystal is greater than 2 $R_c$ ($2R_c < R$), the number density of the abnormal grains is "0", but a large single crystal may not be manufactured because a growth speed of the single crystal is too slow.

With respect to the manufacturing method of the piezoelectric single crystal according to the present invention, the first and second heat treatment processes are carried out at 900 to 1,300° C. for 1 to 100 hours, and it is preferable to carry out the heat treatment at a temperature-raising rate which reaches 1 to 20° C./min.

The heat treatment may be carried out by the adjustment of oxygen partial-pressure. At this time, adjustment of the oxygen partial-pressure may be carried out under the condition of air, an atmosphere of $N_2$ or an atmosphere of $H_2$—$N_2$, and a physical property, which shows a tendency that as a size of the oxygen partial-pressure decreases during the atmosphere, a dielectric constant and a piezoelectric charge constant decrease consecutively, but a coercive field Ec and an internal bias electric field $E_I$ increase, is realized.

Also, the piezoelectric single crystal having the perovskite type structure may cause a size of the internal bias electric field to increase as a defect dipole is induced by the combination of an acceptor and oxygen vacancy.

Accordingly, in case that density of the oxygen vacancy increases due to the addition of an acceptor into the inside of the piezoelectric single crystal, density of the defect dipole also increases naturally, and as a result, simultaneously with an increase in the coercive field, the internal bias electric field also increases.

Thus, when growth of the single crystal using the first and second heat treatment processes is not sufficient, or in order to accelerate the growth, a third heat treatment process aimed at the grown single crystal is further carried out so that an oxygen vacancy content inside of the piezoelectric single crystal can be adjusted.

At this time, a temperature and time required for the third heat treatment process may become different according to an oxygen atmosphere, but preferably, the third heat treatment process may be carried out at 600 to 1,300° C. for 0.1 to 100 hours.

Furthermore, in the manufacturing method of the present invention, the oxygen vacancy content ($0 < z \leq 0.02$) is adjusted by the condition of oxygen partial-pressure within the atmosphere during the third heat treatment process additionally carried out after a single crystal growth process, so the piezoelectric single crystal according to the second exemplary embodiment may be manufactured.

Accordingly, since an internal bias electric field EI which doesn't exist in a general PMN-PT single crystal may be induced sufficiently largely through adjustment of the atmosphere [the size of the oxygen partial-pressure] during the heat treatment process for growth of the single crystal, a novel piezoelectric single crystal having large resistance to external circumstances may be manufactured.

Furthermore, the present invention provides a piezoelectric body in which the piezoelectric single crystal is included alone, or the piezoelectric single crystal and a polymer are mixed.

Although the polymer is not specially limited, as representative one example, when epoxy resins are used in a state of being mixed, the polymer may be provided in a form in which resistance to a mechanical impact is large, and it is easy to perform mechanical processing.

Also, the present invention may provide a piezoelectric application component and a dielectric application component using the piezoelectric body, and examples of the piezoelectric and dielectric application components include ultrasonic transducers (ultrasonographs for medical treatment, transducers for SONAR (sound navigation ranging), transducers for non-destructive inspection, ultrasonic washers, ultrasonic motors, etc.), piezoelectric actuators ($d_{33}$ type actuators, $d_{31}$ type actuators, dis type actuators, piezoelectric actuators intended for controlling minute positions, piezoelectric pumps, piezoelectric valves, and piezoelectric speakers, etc.), piezoelectric sensors (piezoelectric G-meters, etc.), electric field-generating transducers, and electric field and vibration-generating transducers.

Also, examples of the dielectric application components include capacitors having a high degree of efficiency, infrared sensors, dielectric filters, and so on.

MODE FOR CARRYING OUT THE INVENTION

Hereinafter, the present invention is described in detail on the basis of examples.

The present examples should be intended for describing the present invention more specifically, and the scope of the present invention should not be construed as being limited to these examples.

PART 1: Production of Piezoelectric Single Crystals According to the First Exemplary Embodiment, and Evaluation on Dielectric and Piezoelectric Characteristics <Example 1> Production 1 of a Piezoelectric Single Crystal Comprising an Internal Bias Electric Field The piezoelectric single crystal of $[Pb_{0.98-1.5x}Sr_{0.02}La_x]$ $[(Mg_{1/3}Nb_{2/3})_{0.4-y}(Mn_{1/3}Nb_{2/3})_yZr_{0.25}Ti_{0.35}]O_3$ ($0.0 \leq x \leq 0.02$ [a donor content]; $0.0 \leq y \leq 0.1$ [an acceptor content]) was produced by a solid phase single crystal growth method.

An excess of quantity of MgO and PbO were added in a synthetic process of powder so that a second phase of MgO, and a pore reinforcement phase were included in 2 vol %. First, as presented in Table 1 below, ceramic powder having composition of $[Pb_{0.98-1.5x}Sr_{0.02}La_x][(Mg_{1/3}Nb_{2/3})_{0.4-y}$ $(Mn_{1/3} Nb_{2/3})_yZr_{0.25}Ti_{0.35}]O_3$ ($0.0 \leq x \leq 0.02$, $0.0 \leq y \leq 0.1$) was produced using a columbite method. First, a phase of $MgNb_2O_6$ was produced in such a manner as to mix powder of MgO and powder of $Nb_2O_5$ by ball-milling, and then to calcine them, and additionally, perovskite phase powder was produced in such a manner as to mix and calcine raw material powder again at a quantitative ratio. Mixed powder was made by addition of the excess of quantity of PbO and MgO into the produced powder. After the mixed powder was molded, they were pressurized and molded at 200 MPa of hydrostatic pressure, and each powder molding substance was subjected to heat treatment up to for 100 hours at 25° C. intervals under various temperature conditions ranging from 900° C. to 1300° C.

Under the condition that an average size R of matrix grains of a polycrystal may be adjusted into a size range ($0.5R_c \leq R \leq 2R_c$) 0.5 times larger and 2 times smaller than a critical size bringing about the generation of abnormal grains, the quantity of PbO added in the excess of quantity was decided in a range of 10 to 20 mol, and a temperature for heat treatment was decided in a range of 1000 to 1200° C. (the first sintering). Heat treatment (heat treatment for single crystal growth) was carried out in state of putting a seed single crystal of $Ba(Ti_{0.7}Zr_{0.3})O_3$ on such a produced polycrystal, and the single crystal having polycrystalline composition was produced using continuous growth of the seed single crystal inside of the polycrystal.

When the average size R of the matrix grains of the polycrystal was adjusted into the size range ($0.5R_c \leq R \leq 2Rc$) 0.5 times larger and 2 times smaller than the critical size (an average size Rc of the matrix grains showing that number density of the abnormal grains becomes "0 (zero)") bringing about the generation of the abnormal grains, the seed single crystal grew consecutively inside of the polycrystal. In the present example, when the quantity of PbO in the excess of quantity, and the temperature for the heat treatment were adjusted, the average size R of the matrix grains of the polycrystal could be adjusted into the size range 0.5 times larger and 2 times smaller than the critical size bringing about the generation of the abnormal grains. When the average size R of the matrix grains of the polycrystal was adjusted into the size range ($0.5R_c \leq R \leq 2R_c$), during heat treatment, the seed single crystal of $Ba(Ti_{0.7}Zr_{0.3})O_3$ grew consecutively inside the polycrystal of $[Pb_{0.98-1.5x}Sr_{0.02}La_x]$ $[(Mg_{1/3}Nb_{2/3})_{0.4-y}(Mn_{1/3}Nb_{2/3})_yZr_{0.25}Ti_{0.35}]O_3$ ($0.0 \leq x \leq 0.02$; $0.0 \leq y \leq 0.1$), so the single crystal having composition like the polycrystal was produced. At this time, a size of the grown single crystal was 20×20 mm* or more.

Concerning one example of the piezoelectric single crystal produced as described above, FIG. 1 shows a piezoelectric single crystal of $[Pb_{0.98-1.5x}Sr_{0.02}La_x][(Mg_{1/3}Nb_{2/3})_{0.4-y}$ $(Mn_{1/3}Nb_{2/3})_yZr_{0.25}Ti_{0.35}]O_3$ (x=0.1; y=0), and FIG. 2 shows a piezoelectric single crystal of $[Pb_{0.98-1.5x}Sr_{0.02}La_x]$ $[(Mg_{1/3}Nb_{2/3})_{0.4-y}(Mn_{1/3}Nb_{2/3})_yZr_{0.25}Ti_{0.35}]O_3$ (x=0.01; y=0.05). At this time, in FIG. 2, the piezoelectric single crystal is black-colored by the addition of Mn under the condition of air, an atmosphere of single crystal growth.

Also, the piezoelectric single crystal could be produced in such a manner as to change the oxygen partial-pressure within the atmosphere during the first sintering for the ceramic powder molding substance, and the heat treatment for single crystal growth, and as one example thereof, a piezoelectric single crystal of $[Pb_{0.98-1.5x}Sr_{0.02}La_x][(Mg_{1/3}$ $Nb_{2/3})_{0.4-y}(Mn_{1/3}Nb_{2/3})_yZr_{0.25}Ti_{0.35}]O_3$ (x=0.01; y=0.05) shown in FIG. 3 could be produced. At this time, the piezoelectric single crystal was confirmed to be black-colored by the addition of Mn under the condition of $N_2$—$H_2$, the atmosphere of single crystal growth.

<Example 2> Production 2 of a Piezoelectric Single Crystal Comprising an Internal Bias Electric Field The piezoelectric single crystal of $[Pb_{0.98-1.5x}Sr_{0.02}Sm_x]$ $[(Mg_{1/3}Nb_{2/3})_{0.25}(Ni_{1/3}Nb_{2/3})_{0.10-y}(Mn_{1/3}Nb_{2/3})_y$ $Zr_{0.30}$ $Ti_{0.35}]O_3$ $(0.0 \le x \le 0.02$ [a donor content]; $0.0 \le y \le 0.1$ [an acceptor content]) was produced by the same processes as those performed in said Example 1.

<Experimental Example 1> Evaluation on Dielectric and Piezoelectric Characteristics Concerning the Piezoelectric Single Crystal Shown in Example 1

With respect to the piezoelectric single crystal of $[Pb_{0.98-1.5x}Sr_{0.02}La_x][(Mg_{1/3}Nb_{2/3})_{0.4-y}(Mn_{1/3}Nb_{2/3})_yZr_{0.25}$ $Ti_{0.35}]O_3$ $(0.03 \le x \le 0.02$ [a donor content]; $0.0 \le y \le 0.1$ [an acceptor content]) produced in said Example 1, dielectric and piezoelectric characteristics of the piezoelectric single crystal, which was produced in such a manner as to adjust composition (a change in x and y) from piezoelectric single crystals presented in Table 1, and oxygen partial-pressure inside an atmosphere during a first sintering process for a ceramic powder molding, and heat treatment for single crystal growth presented in Table 2, were evaluated.

Specifically, with respect to the single crystal of $[Pb_{0.98-1.5x}Sr_{0.02}La_x][(Mg_{1/3}Nb_{2/3})_{0.4-y}(Mn_{1/3}Nb_{2/3})_yZr_{0.25}$ $Ti_{0.35}]O_3$ $(0.05 \le x \le 0.02; 0.0 \le y \le 0.1)$ produced as described above, each change in characteristics of a dielectric constant, phase transition temperatures $T_C$ and $T_{RT}$, a piezoelectric charge constant, a coercive field $E_c$, and an internal bias electric field Er resulting from a change in x [the donor content] and y [the Mn content] was measured by the IEEE method using an impedance analyzer, and so on, and was described in Table 1 below.

TABLE 1

|  | Comparative Example 1 | Example 1-1 | Example 1-2 | Comparative Example 2 | Example 1-3 | Example 1-4 | Example 1-5 |
|---|---|---|---|---|---|---|---|
| x/y | 0.00/0.05 | 0.005/0.05 | 0.005/0.10 | 0.01/0.00 | 0.01/0.05 | 0.01/0.10 | 0.015/0.10 |
| Dielectric constant | 5,640 | 6,210 | 4,370 | 8,773 | 6,920 | 6,050 | 4,770 |
| $T_c/T_{kt}$ [° C.] | 172/116 | 162/112 | 165/106 | 153/104 | 155/108 | 159/106 | 140/91 |
| tan δ [%] | 0.4 | 0.4 | 0.2 | 0.5 | 0.3 | 0.2 | 0.3 |
| $d_{33}$ [pc/N] | 1,600 | 1,840 | 1,520 | 2,650 | 1,760 | 1,580 | 1,680 |
| $E_c$ [kV/cm] | 4.2 | 4.4 | 4.8 | 3.8 | 4.4 | 4.9 | 4.5 |
| $E_I$ [kV/cm] | 0.4 | 0.8 | 1.4 | 0.0 | 1.0 | 1.6 | 1.5 |

As confirmed through Table 1 above, in case of a piezoelectric single crystal (x=0.0, y=0.05) (Comparative Example 1), as a result of evaluation on the characteristics of a piezoelectric charge constant, a dielectric constant, and a dielectric loss, since the piezoelectric charge constant $d_{33}$ was 1,600 pC/N, the dielectric constant was 5,640, the dielectric loss tan δ was 0.4%, the dielectric and piezoelectric characteristics were excellent. At this time, the internal bias electric field $E_I$ was 0.4.

Also, in case of (001) a piezoelectric single crystal (x=0.01, y=0.0) (Comparative Example 2), the piezoelectric charge constant $d_{33}$ was 2, 650 pC/N, the dielectric constant was 8, 773, and the electric loss tan δ was 0.5%. At this time, the internal bias electric field $E_I$ was 0.

On the contrary, in case of the piezoelectric single crystals produced according to a change in x [the donor content] and y [the Mn content], as x [the donor content] increased, the dielectric constant and the piezoelectric charge constant also increased, whereas as y [the Mn content] increased, the dielectric constant and the piezoelectric charge constant decreased consecutively, but the coercive field $E_C$ and the internal bias electric field $E_I$ increased.

Also, as shown in Table 1, with respect to the piezoelectric single crystals of the present invention, in case that the values of x [the donor content] and y [the Mn content] were beyond fixed values (x≠0.0 and y≠0.0), the dielectric constant and the piezoelectric charge constant were maintained to be similar to those of a general PMN-PT single crystal, and at the same time, the coercive field $E_C$ and the internal bias electric field $E_I$ could increase largely. In particular, since the internal bias electric field $E_I$ which doesn't exist in the general PMN-PT single crystal could be induced sufficiently largely, novel piezoelectric single crystals having large resistance to external circumstances were developed.

Also, with respect to the piezoelectric single crystal of $[Pb_{0.98-1.5x}Sr_{0.02}La_x][(Mg_{1/3}Nb_{2/3})_{0.4-y}(Mn_{1/3}Nb_{2/3})_yZr_{0.25}$ $Ti_{0.35}]O_3$ $(x \le 0.02; 0.0 \le y \le 0.1)$ produced as presented above, physical properties described in Table 2 below resulted from observations on each change in physical properties of the piezoelectric single crystal according to a change in atmosphere (a size of oxygen partial-pressure) during the first sintering, and a heat treatment process for single crystal growth.

TABLE 2

| x/y | Comparative Example 2 0.01/0.00 | | | Example 1-3 0.01/0.05 | | |
|---|---|---|---|---|---|---|
| Atmosphere | Air | $N_2$ | $H_2$—$N_2$ | Air | $N_2$ | $H_2$—$N_2$ |
| Dielectric constant | 8,750 | 7,940 | 6,110 | 6,920 | 6,260 | 5,510 |

TABLE 2-continued

| x/y | Comparative Example 2 0.01/0.00 | | | Example 1-3 0.01/0.05 | | |
|---|---|---|---|---|---|---|
| Atmosphere | Air | $N_2$ | $H_2$—$N_2$ | Air | $N_2$ | $H_2$—$N_2$ |
| $d_{33}$ [pc/N] | 2,650 | 2,330 | 1,720 | 1,760 | 1,610 | 1,530 |
| $E_c$ [kV/cm] | 3.8 | 3.9 | 4.3 | 4.4 | 4.6 | 5.2 |
| $E_I$ [kV/cm] | 0.0 | 0.2 | 0.5 | 1.0 | 1.1 | 1.6 |

As shown in Table 2 above, as the size of the oxygen partial-pressure within the atmosphere during the first sintering and the heat treatment for single crystal growth decreased, the dielectric constant and the piezoelectric charge constant decreased consecutively, but the coercive field $E_C$ and the internal bias electric field $E_I$ increased.

This effect tended to increase more as the values of x [the donor content] and y [the Mn content] got larger. Accordingly, when the piezoelectric single crystals comprising x [the donor content] and y [the Mn content] were produced under the condition that the oxygen partial-pressure was low, the dielectric constant and the piezoelectric charge constant were maintained to be similar to those of the general PMN-PT single crystal, and at the same time, the coercive field $E_C$ and the internal bias electric field $E_I$ could increase largely.

As described above, according to the present invention, since the internal bias electric field EI which doesn't exist in the general PMN-PT single crystal could be induced suffiprocess for a ceramic powder molding substance presented in Table 4, and heat treatment for single crystal growth, were evaluated.

Each change in characteristics of a dielectric constant, phase transition temperatures $T_C$ and $T_{RT}$, a piezoelectric charge constant, a coercive field $E_C$, and an internal bias electric field $E_I$ of the piezoelectric single crystal of $[Pb_{0.98-1.5x}Sr_{0.02}Sm_x][(Mg_{1/3}Nb_{2/3})_{0.25}(Ni_{1/3}Nb_{2/3})_{0.10-y}(Mn_{1/3}Nb_{2/3})_y Zr_{0.30}Ti_{0.35}]O_3$ ($0.05 \leq x \leq 0.02$; $0.0 \leq y \leq 0.1$) was measured by the IEEE method using an impedance analyzer, and so on, and was described in Table 3 below.

TABLE 3

| | Comparative Example 3 | Example 2-1 | Example 2-2 | Comparative Example 4 | Example 2-3 | Example 2-4 | Example 2-5 |
|---|---|---|---|---|---|---|---|
| x/y | 0.00/0.05 | 0.005/0.05 | 0.005/0.10 | 0.01/0.00 | 0.01/0.05 | 0.01/0.10 | 0.015/0.10 |
| Dielectric constant | 6,490 | 8,820 | 6,360 | 14,680 | 9,850 | 7,440 | 8,180 |
| $T_c/T_{kt}$ [° C.] | 162/107 | 149/99 | 153/91 | 141/85 | 146/89 | 144/87 | 132/79 |
| tan δ [%] | 0.7 | 0.8 | 0.5 | 1.0 | 0.7 | 0.5 | 0.5 |
| $d_{33}$ [pC/N] | 1,970 | 2,260 | 1,710 | 4,460 | 3,040 | 1,930 | 2,330 |
| $E_c$ [kV/cm] | 3.6 | 3.9 | 4.6 | 3.2 | 4.2 | 4.7 | 4.4 |
| $E_I$ [kV/cm] | 0.4 | 0.7 | 1.1 | 0.0 | 0.6 | 1.2 | 1.1 | ciently largely by adjustment of the atmosphere [the size of the oxygen partial-pressure] during the first sintering, and the heat treatment process for single crystal growth, the novel piezoelectric single crystals having large resistance to external circumstances could be developed.

Based on the result, with respect to the single crystal of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ ($0.0 \leq x \leq 0.02$; $0.0 \leq y \leq 0.1$), in case that "x [the donor content]", "y [the Mn content]", and "a ratio of x/y" were adjusted, and at the same time as this, the atmosphere [the size of the oxygen partial-pressure] during t sintering, and the heat treatment process for single crystal growth was adjusted, it was confirmed that the piezoelectric charge constant, the coercive field $E_C$, and the internal bias electric field $E_I$ of the produced piezoelectric single crystal could be most suitable.

Accordingly, the piezoelectric single crystals comprising the internal bias electric field $E_I$ over a specific size ($E_I > 0.5$ or $1.0$ kV/cm) were characteristic in that their high piezoelectric characteristics were stably maintained with respect to a change in external circumstances unlike those of the existing general PMN-PT or PIN-PMN-PT single crystal.

<Experimental Example 2> Evaluation on Dielectric and Piezoelectric Characteristics Concerning the Piezoelectric Single Crystal Shown in Example 2

With respect to the piezoelectric single crystal $[Pb_{0.98-1.5x}Sr_{0.02}Sm_x][(Mg_{1/3}Nb_{2/3})_{0.25}(Ni_{1/3}Nb_{2/3})_{0.10-y}(Mn_{1/3}Nb_{2/3})_y Zr_{0.30}Ti_{0.35}]O_3$ ($0.0 \leq x \leq 0.02$ [donor content]; $0.0 \leq y \leq 0.1$ [acceptor content]) produced in Example said 2, dielectric and piezoelectric characteristics of the piezoelectric single crystal, which was produced in such a manner as to adjust composition (the change in x and y) from piezoelectric single crystals presented in Table 3, and oxygen partial-pressure within an atmosphere during a first sintering As a result of evaluating the characteristics of the piezoelectric charge constant, the dielectric constant, and a dielectric loss of each single crystal shown in Table 3, with respect to the piezoelectric single crystal of $[Pb_{0.98-1.5x}Sr_{0.02}Sm_x][(Mg_{1/3}Nb_{2/3})_{0.25}(Ni_{1/3}Nb_{2/3})_{0.10-y}(Mn_{1/3}Nb_{2/3})_y Zr_{0.30} Ti_{0.35}]O_3$ ($0.0 \leq x \leq 0.02$; $0.0 \leq y \leq 0.1$) using a solid phase single crystal growth method, in case of composition (x=0.0, y=0.05) (Comparative Example 3), and in case of composition (x=0.01, y=0.0) (Comparative Example 4), characteristics of the piezoelectric charge constant $d_{33}$, the dielectric constant, and the dielectric loss tan δ were confirmed to be excellent, but the internal bias electric field $E_I$ was low or wasn't induced.

Accordingly, as shown in Table 3, with respect to the piezoelectric single crystal of the present invention, in case that the values of x and y are beyond fixed values (x≠0.0 and y≠0.0), it was confirmed that the dielectric constant and the piezoelectric charge constant were maintained to be similar to those shown in a general PMN-PT single crystal, and at the same time as this, the coercive field $E_C$ and the internal bias electric field $E_I$ could increase largely.

In particular, since the internal bias electric field $E_I$ which doesn't exist in the general PMN-PT single crystal could be induced sufficiently largely, the novel piezoelectric single crystals having large resistance to external circumstance could be developed.

With respect to the piezoelectric single crystal of $[Pb_{0.98-1.5x}Sr_{0.02}Sm_x][(Mg_{1/3}Nb_{2/3})_{0.25}(Ni_{1/3}Nb_{2/3})_{0.10-y}(Mn_{1/3}Nb_{2/3})_y Zr_{0.30}Ti_{0.35}]O_3$ ($0.0 \leq x \leq 0.02$; $0.0 \leq y \leq 0.1$) produced as presented above, the physical properties described in Table 4 below resulted from observations on each change in physical properties of the piezoelectric single crystal according to a change in atmosphere (the size of oxygen partial-pressure) during the first sintering, and the heat treatment process for single crystal growth.

TABLE 4

| x/y | Comparative Example 4 0.01/0.00 | | | Example 2-3 0.01/0.05 | | |
|---|---|---|---|---|---|---|
| Atmosphere | Air | $N_2$ | $H_2$—$N_2$ | Air | $N_2$ | $H_2$—$N_2$ |
| Dielectric constant | 14,680 | 12,670 | 9,100 | 9,850 | 7,930 | 6,410 |
| $d_{33}$ [pC/N] | 4,460 | 3,780 | 2,560 | 3,040 | 2,660 | 1,940 |
| $E_c$ [kV/cm] | 3.2 | 3.8 | 4.4 | 4.2 | 4.5 | 5.1 |
| $E_I$ [kV/cm] | 0.0 | 0.3 | 0.6 | 0.6 | 1.0 | 1.5 |

As shown in Table 4 above, as the size of the oxygen partial-pressure within the atmosphere during the first sintering and the heat treatment for single crystal growth decreased, the dielectric constant and the piezoelectric charge constant decreased consecutively, but the coercive field $E_C$ and the internal bias electric field $E_I$ increased.

This effect tended to increase more as the values of x [the donor content] and y [the Mn content] got larger, and when the piezoelectric single crystals comprising x [the donor content] and y [the Mn content] were produced under the condition that the oxygen partial-pressure was low, it was confirmed that the dielectric constant and the piezoelectric charge constant were maintained to be similar to those shown in the general PMN-PT single crystal, and at the same time, the coercive field $E_C$ and the internal bias electric field $E_I$ could increase largely.

Thus, according to the present invention, since the internal bias electric field $E_I$ which doesn't exist in the general PMN-PT single crystal could be induced sufficiently largely by adjustment of the atmosphere [the size of the oxygen partial-pressure] during the first sintering, and the heat treatment process for single crystal growth, the novel piezoelectric single crystals having large resistance to external circumstances could be developed.

Based on the result, with respect to the single crystal of $[Pb_{0.98-1.5x}Sr_{0.02}Sm_x][(Mg_{1/3}Nb_{2/3})_{0.25}(Ni_{1/3}Nb_{2/3})_{0.10-y}(Mn_{1/3}Nb_{2/3})_y Zr_{0.30}Ti_{0.35}]O_3$ (0.05≤x≤0.02; 0.0≤y≤0.1), in case that "x [the donor content]", "y [the Mn content]", and "a ratio of x/y" were adjusted, and at the same time as this, the atmosphere [the size of the oxygen partial-pressure] during the first sintering, and the heat treatment process for single crystal growth was adjusted, it was confirmed that the piezoelectric charge constant, the coercive field $E_C$, and the internal bias electric field $E_I$ of the produced piezoelectric single crystal could be suitable. Accordingly, the piezoelectric single crystals most comprising the internal bias electric field $E_I$ over a specific size ($E_I$>0.5 or 1.0 kV/cm) were characteristic in that their high piezoelectric characteristics were stably maintained with respect to a change in external circumstances unlike those of the existing general PMN-PT or PIN-PMN-PT single crystal.

<Experimental Example 3> Observations on a Change Internal Bias Electric Field Resulting from a Change in Temperature Each of the piezoelectric single crystal of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ (x=0.01; y=0.05) shown in said Example 1, and a general PMN-30PT piezoelectric single crystal was produced by a solid phase single crystal growth method. A measurement sample having a size of "(001) 4×4×0.5 (T) mm" was made using the piezoelectric single crystals produced as described above, and each change in the coercive field $E_C$ and the internal bias electric field Er according to an increase in temperature was observed.

FIG. 4 is a graph showing a change in polarization to the electric field of the piezoelectric single crystal [an atmosphere for single crystal growth-air] of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ (x=0.01; y=0.05) shown in said Example 1, simultaneously with increasing a temperature at the normal temperature, each change in the coercive field and the internal bias electric field was observed.

As a result, the coercive field $E_C$ and the internal bias electric field $E_I$ were 4.4 and 1.0 kV/cm, respectively, at 25° C., and when the temperature increased to 80° C., the coercive field $E_C$ and the internal bias electric field decreased to 2.3 and 0.6 kV/cm, respectively.

FIG. 5 is a graph resulting from observing a change in polarization to the electric field of the general PMN-30PT piezoelectric single crystal [an atmosphere single crystal growth–air] produced by the solid phase single crystal growth method, and simultaneously with increasing a temperature at the normal temperature, each change in the coercive field and the internal bias electric field was observed.

As a result, the coercive field was 2.5 kV/cm, and no internal bias electric field was observed. Furthermore, when the temperature increased to 80° C., the coercive field decreased to 1.2 kV/cm remarkably.

Based on the result, with respect to the piezoelectric single crystal [the atmosphere for single crystal growth-air] of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ (x=0.01; y=0.05) shown in said Example 1 according to the present invention, the coercive field was about two times greater than that shown in the general PMN-30PT piezoelectric single crystal [an atmosphere for single crystal growth-air], and in particular, the piezoelectric single crystal had the characteristic of comprising the internal bias electric field.

Also, it maintains the coercive field and the internal electric field even when the temperature is increased, showing the characteristic of maintaining the characteristic without depoling to the temperature change. In particular, t was confirmed that the coercive field of the piezoelectric single crystal [the atmosphere for single crystal growth-air] of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ (x=0.01; y=0.05) at 80° C. was similar to that of the PMN-30PT piezoelectric single crystal [the atmosphere for single crystal growth-air] at the normal temperature, and the piezoelectric single crystal maintained the internal bias field and showed high stability.

<Experimental Example 4> Observations on a Change in Internal Bias Electric Field According to the Condition of Oxygen Partial-Pressure The piezoelectric single crystal of $[Pb_{0.98-1.5x}Sr_{0.02}La_x][(Mg_{1/3}Nb_{2/3})_{0.4-y}(Mn_{1/3}Nb_{2/3})_y Zr_{0.25}Ti_{0.35}]O_3$ (x=0.01;

y=0.1) shown in said Example 1 was produced by a solid phase single crystal growth method. Under an atmosphere of $N_2$—$H_2$ during the first sintering and heat treatment for single crystal growth in the manufacturing process, a measurement sample having a size of "(001) 4×4×0.5 (T) mm" was produced using the piezoelectric single crystals produced by adjustment of the oxygen partial-pressure, and each change in the coercive field $E_C$ and the internal bias electric field $E_I$ was observed.

FIG. 6 is a polarization to electric field graph of the piezoelectric single crystal [an atmosphere for single crystal growth—$N_2$—$H_2$] of $[Pb_{0.98-1.5x}Sr_{0.02}La_x][(Mg_{1/3}Nb_{2/3})_{0.4-y}(Mn_{1/3}Nb_{2/3})_yZr_{0.25}Ti_{0.35}]O_3$ (x=0.01; y=0.1, Example 1-4), wherein it was confirmed that when the piezoelectric single crystal having x [the donor content] and y [the Mn content] over a fixed size was produced under the condition that oxygen partial-pressure was low, the coercive field $E_C$ and the internal bias electric field $E_I$ could largely increase to 5.6 and 2.8 kV/cm, respectively.

Based on the above fact, it was confirmed that the internal bias electric field $E_I$ which doesn't exist in a general PMN-PT single crystal could be induced sufficiently largely by adjustment of the atmosphere [the size of the oxygen partial-pressure] during the first sintering and the heat treatment process for single crystal growth simultaneously with adjustment of x [the donor content] and y [the Mn content] from the composition of the piezoelectric single crystal.

Part 2: Production of Piezoelectric Single Crystals According to the Second Exemplary Embodiment, and Evaluation on Dielectric and Piezoelectric Characteristics <Example 3> Production 1 of a Piezoelectric Single Crystal Comprising Oxygen Vacancy The piezoelectric single crystal of $[Pb_{0.98-1.5x}Sr_{0.02}Sm_x][(Mg_{1/3}Nb_{2/3})_{0.35}Zr_{0.30}Ti_{0.35}]O_{3-z}$ (0.0≤x≤0.02 [a donor content]; 0.0≤z≤0.03 [an oxygen vacancy content]) was produced by a solid phase single crystal growth method.

An excess of quantity of MgO and PbO were added during a synthetic process of powder so that a second phase of MgO, and a pore reinforcement phase were included in the range of 2 vol %. First, as presented in Table 5 below, ceramic powder having composition of $[Pb_{0.98-1.5x}Sr_{0.02}Sm_x][(Mg_{1/3}Nb_{2/3})_{0.35}Zr_{0.30}Ti_{0.35}]O_{3-z}$ (0.0≤x≤0.02; 0.0≤z≤0.03) was produced using a columbite method. First, a phase of $MgNb_2O_6$ was produced in such a manner as to mix powder of MgO and powder of $Nb_2O_5$ by ball-milling, and then to calcine them, and additionally, perovskite type powder was produced in such a manner as to mix raw material powder again at a quantitative ratio, and to calcine them (a calcining process). Mixed powder was made by addition of the excess of quantity of PbO and MgO into the produced powder. After the mixed powder was molded, they were pressurized and molded at 200 Ma of hydrostatic pressure, and each powder molding substance was subjected to heat treatment up to for 100 hours at 25° C. intervals under various temperature conditions: from 900° C. to 1300° C. Under the condition that an average size R of matrix grains of a polycrystal could be adjusted into a size range (0.5R$_c$≤R≤2Rc) 0.5 times larger and d 2 times smaller than a critical size bringing about the generation of abnormal grains, the quantity of PbO added in the excess of quantity was decided in a range of 10 to 20 mol %, and a temperature for heat treatment was decided in a range of 1000 to 1200° C. (a sintering process, a first heat treatment process). A heat treatment process (heat treatment for single crystal growth, a second heat treatment process) was carried out in a state of putting a seed single crystal of $Ba(Ti_{0.7}Zr_{0.3})O_3$ on such a produced polycrystal, and the single crystal having polycrystalline composition was produced using continuous growth of the seed single crystal inside of the polycrystal.

When the average size R of the matrix grains of the polycrystal was adjusted into the size range (0.5R$_c$≤R≤2Rc) 0.5 times larger and 2 times smaller than the critical size (an average size Re of the matrix grains showing that number density of the abnormal grains becomes "0 (zero)") bringing about the generation of the abnormal grains, the seed single crystal grew consecutively inside of the polycrystal. In the present example, when the quantity of PbO added in the excess of quantity, and the temperature for the heat treatment were adjusted, the average size R of the matrix grains of the polycrystal could be adjusted into the size range 0.5 times larger and 2 times smaller than the critical size bringing about the generation of the abnormal grains. When the average size R of the matrix grains of the polycrystal was adjusted into the size range of 0.5R$_c$≤R≤2R$_c$, the seed single crystal of $Ba(Ti_{0.7}Zr_{0.3})O_3$ grew consecutively inside of the polycrystal during the heat treatment, so the single crystal having composition like the polycrystal was produced. At this time, a size of the grown single crystal was 20×20 m* or more.

An oxygen vacancy content z was adjusted by the adjustment of oxygen partial-pressure within an atmosphere during the processes of making the single crystal [the powder calcination process, the process of sintering the powder molding substance (the first heat treatment), and the single crystal growth process (the second heat treatment)], and the grown single crystal was additionally subjected to heat treatment (a third heat treatment process), so various piezoelectric single crystals of $[Pb_{0.98-1.5x}Sr_{0.02}Sm_x][(Mg_{1/3}Nb_{2/3})_{0.35}Zr_{0.30}Ti_{0.35}]O_{3-z}$ (0.0≤x≤0.02; 0<z≤0.03) were finally produced in the range of "0.0≤z≤0.03".

With respect to the piezoelectric single crystals, the composition (a change in x) and the oxygen partial-pressure within the atmosphere during the heat treatment processes [the powder calcination process, the process of sintering the powder molding substance (the first heat treatment), the single crystal growth process (the second heat treatment), and the additional heat treatment after the single crystal growth process (the third heat treatment)] were adjusted, so various piezoelectric single crystals having "0<z≤0.03 [the oxygen vacancy content]" as shown in Table 5 and Table 6 were produced.

<Example 4> Production 2 of a Piezoelectric Single Crystal Comprising Oxygen Vacancy The same processes as those shown in said Example 3 were carried out, and the piezoelectric single crystal based on composition of $[Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ (0.0≤x≤0.02 [a donor content]; 0.0≤z≤0.0.03 [an oxygen vacancy content]) was produced.

An excess of quantity of MgO and PbO were added in a synthetic process of powder so that a second phase of MgO, and a pore reinforcement phase could be included in the range of 2 vol %. Furthermore, the oxygen vacancy content z was adjusted by the adjustment of oxygen partial-pressure within an atmosphere during processes of making the single crystal [a powder calcination process, a process of sintering a powder molding substance (a first heat treatment process), and a single crystal growth process (a second heat treatment process)], and the grown single crystal was additionally subjected to heat treatment (a third heat treatment process), so various piezoelectric single crystals of $[Pb_{0.98-1.5x}$ $Sr_{0.02}La_x][(Mg_{1/3}Nb_{2/3})_{0.35}(Mn_{1/3}Nb_{2/3})_{0.05}Zr_{0.25}Ti_{0.35}]$ $O_{3-z}$ ($0.05 \le x \le 0.02$; $0 < z \le 0.03$) were finally produced in the range of "$0.0 \le z \le 0.03$".

With respect to the piezoelectric single crystals, the composition (a change in x) and oxygen partial-pressure within the atmosphere during the heat treatment [the powder calcination process, the process of sintering the powder molding substance (the first heat treatment), the single crystal growth process (the second heat treatment), and the additional heat treatment after the single crystal growth process (the third heat treatment] were adjusted, so various piezoelectric single crystals satisfying "$0 < z \le 0.03$ [the oxygen vacancy content]" as shown in Table 7 and Table 8 were produced.

<Experimental Example 5> Evaluation 1 on
Dielectric and Piezoelectric Characteristics
Concerning the Piezoelectric Single Crystal Shown
in Example 3

With respect to the piezoelectric single crystal of $[Pb_{0.98-1.5x}Sr_{0.02}Sm_x][(Mg_{1/3}Nb_{2/3})_{0.35}Zr_{0.30}Ti_{0.35}]O_{3-z}$ ($0.0 \le x \le 0.02$; $0.0 \le z \le 0.03$) produced in said Example 3, the dielectric and piezoelectric characteristics were evaluated.

Specifically, with respect to the produced single crystal of $[Pb_{0.98-1.5x}Sr_{0.02}Sm_x][(Mg_{1/3}Nb_{2/3})_{0.35}Zr_{0.30}Ti_{0.35}]O_{3-z}$ ($0.0 \le x \le 0.02$; $0.0 \le z \le 0.03$), each change in characteristics of a dielectric constant, phase transition temperatures $T_C$ and $T_{RT}$, a piezoelectric charge constant, a coercive field $E_c$, and an internal bias electric field $E_I$ resulting from a change in x [a donor content] and z [an oxygen vacancy content] was measured by the IEEE method using an impedance analytical analyzer, and so on, and was described in Table 5 below.

similar to those shown in a general PMN-PT single crystal, and at the same time as this, the coercive field $E_C$ and the internal bias electric field $E_I$ could increase largely. In particular, since the internal bias electric field $E_I$ which doesn't exist in the general PMN-PT single crystal could be induced sufficiently largely, the novel piezoelectric single crystals having large resistance to external circumstances could be developed.

<Experimental Example 6> Evaluation 2 on
Dielectric and Piezoelectric Characteristics
Concerning the Piezoelectric Single Crystals Shown
in Example 3

Among the single crystals of $[Pb_{0.98-1.5x}Sr_{0.02}Sm_x]$ $[(Mg_{1/3} Nb_{2/3})_{0.35}Zr_{0.30}Ti_{0.35}]O_{3-z}$ ($0.0 \le x \le 0.02$; $0 < z \le 0.03$) shown in said Example 3, FIG. 7 shows the piezoelectric single crystal satisfying the requisite of x=0.01 and z=0.0 (Comparative Example 5), FIG. 8 shows the piezoelectric single crystal satisfying the requisite of x=0.01 and z=0.005 (Example 3-3), and FIG. 9 the piezoelectric single crystal satisfying the requisite of x=0.01, and z=0.01 (Example 3-4).

At this time, with respect to the single crystals satisfying the requisite "x=0.01; z=0.005 (Example 3-3)" presented in FIG. 8, and the requisite "x=0.01; z=0.01 (Example 3-4)" presented in FIG. 9, respectively, after single crystal growth processes were finished, a third heat treatment process was again carried out, and an atmosphere [a size of oxygen partial-pressure] during the third heat treatment process was adjusted, so "z [an oxygen vacancy content]" increased.

Also, each change in characteristics of a dielectric constant, a piezoelectric charge constant, a coercive field $E_C$, and an internal bias electric field $E_I$ of the piezoelectric

TABLE 5

| Subject Area | Example 3-1 | Example 3-2 | Comparative Example 5 | Example 3-3 | Example 3-4 | Example 3-5 | Example 3-6 | Example 3-7 |
|---|---|---|---|---|---|---|---|---|
| x/z | 0.00/0.01 | 0.005/0.01 | 0.01/0.00 | 0.01/0.005 | 0.01/0.01 | 0.01/0.02 | 0.01/0.03 | 0.015/0.01 |
| Dielectric constant | 6,210 | 7,320 | 14,678 | 12,550 | 8,670 | 6,120 | 3,140 | 8,970 |
| $T_c/T_{kt}$ [° C.] | 155/98 | 146/92 | 141/85 | 140/83 | 139/83 | 135/82 | 125/73 | 132/79 |
| tan δ [%] | 1.4 | 1.2 | 1.0 | 1.1 | 1.3 | 1.7 | 3.1 | 1.5 |
| $d_{33}$ [pC/N] | 1,670 | 2,740 | 4,457 | 3,780 | 3,110 | 2,120 | 1,220 | 3,340 |
| $E_c$ [kV/cm] | 4.2 | 3.9 | 3.2 | 3.7 | 4.7 | 5.6 | 5.9 | 4.4 |
| $E_I$ [kV/cm] | 1.1 | 1.5 | 0.0 | 0.9 | 1.8 | 2.6 | 2.8 | 1.1 |

As confirmed through Table 5 above, in case of (001) the piezoelectric single crystal (x=0.01, z=0.0) (Comparative Example 5), the piezoelectric charge constant $d_{33}$ was 4,457 pC/N, the dielectric constant was 14, 678, and a dielectric loss tan δ was 1.0%.

On the contrary, physical properties of the piezoelectric single crystal were observed to change largely according to a change in x [the donor content] and $0 < z$ [the oxygen vacancy content]. That is, as x [the donor content] increased, the dielectric constant and the piezoelectric charge constant also increased, and as $0 < z$ [the oxygen vacancy content] increased, the dielectric constant and the piezoelectric charge constant decreased consecutively, but the coercive field $E_C$ and the internal bias electric charge $E_I$ increased.

Accordingly, in case that the values of x [the donor content] and z [the oxygen vacancy content] were beyond fixed values (x≠0.0 and z≠0.0), the dielectric constant and the piezoelectric charge constant were maintained to be single crystal after the third heat treatment was measured by the IEEE method using an impedance analyzer, and so on, and was described in Table 6 below.

TABLE 6

| | Example 3-3 | | | Example 3-4 | | |
|---|---|---|---|---|---|---|
| x/z (before heat treatment) | 0.01/0.005 | | | 0.01/0.01 | | |
| z (after heat treatment) | 0.05 | 0.01 | 0.02 | 0.01 | 0.02 | 0.03 |
| Dielectric constant | 11,920 | 8,280 | 6,030 | 8,210 | 6,010 | 2,730 |
| $d_{33}$ [pC/N] | 3,430 | 2,880 | 1,950 | 2,970 | 1,910 | 1,130 |
| $E_c$ [kV/cm] | 3.9 | 4.9 | 5.8 | 4.8 | 5.7 | 6.2 |
| $E_I$ [kV/cm] | 0.8 | 2.1 | 2.5 | 1.9 | 2.4 | 3.0 |

As shown in Table 6 above, after the single crystal growth processes were finished, the third heat treatment was again carried out, and physical properties of the piezoelectric single crystals simultaneously with the oxygen vacancy content z according to a change in the atmosphere [the size of the oxygen partial-pressure] during the heat treatment process were observed to change largely.

As the size of the oxygen partial-pressure within the atmosphere during the heat treatment decreased, the dielectric constant and the piezoelectric charge constant also decreased consecutively, but the coercive field $E_C$ and the internal bias electric field $E_I$ increased. Also, this effect tended to increase more as the values of x [a donor content] and z [an oxygen vacancy content] got larger.

Accordingly, when the piezoelectric single crystals comprising x [the donor content] and z [the oxygen vacancy content] partial-pressure was low, the dielectric constant and the piezoelectric charge constant were maintained to be similar to those shown in a general PMN-PT single crystal, and at the same time, the coercive field $E_C$ and the internal bias electric field $E_I$ could increase largely.

<Experimental Example 7> Evaluation 1 on Dielectric and Piezoelectric Characteristics Concerning the Piezoelectric Single Crystal Shown in Example 4

With respect to the piezoelectric single crystal of $[Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ ($0.0{\leq}x{\leq}0.02$; $0.0{\leq}z{\leq}0.03$) produced in said Example 4, dielectric and piezoelectric characteristics were evaluated.

With respect to the produced single crystal of $Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ ($0.05{\leq}x{\leq}0.02$; $0.0{\leq}z{\leq}0.03$), each change in characteristics of a dielectric constant, phase transition temperatures $T_C$ and $T_{RT}$, a piezoelectric charge constant, a coercive field Ec, and an internal bias electric field $E_I$ resulting from a change in x [a donor content] and z [an oxygen vacancy content] was measured by the IEEE method using an impedance analyzer, and so on, and was described in Table 7 below.

TABLE 7

| Subject Area | Example 4-1 | Example 4-2 | Comparative Example 6 | Example 4-3 | Example 4-4 | Example 4-5 | Example 4-6 | Example 4-7 |
|---|---|---|---|---|---|---|---|---|
| x/z | 0.00/0.01 | 0.005/0.01 | 0.01/0.00 | 0.01/0.005 | 0.01/0.01 | 0.01/0.02 | 0.01/0.03 | 0.015/0.01 |
| Dielectric constant | 5,020 | 5,950 | 6,920 | 6,750 | 6,430 | 6,010 | 3,050 | 5,220 |
| $T_c/T_{kt}$ [° C.] | 169/121 | 164/114 | 155/108 | 153/106 | 151/101 | 149/99 | 148/98 | 138/89 |
| tan δ [%] | 0.3 | 0.4 | 0.3 | 0.3 | 0.2 | 0.2 | 2.5 | 1.2 |
| $d_{33}$ [pC/N] | 1,510 | 1,620 | 1,760 | 1,710 | 1,690 | 1,540 | 920 | 1,710 |
| $E_c$ [kV/cm] | 4.2 | 3.9 | 4.4 | 4.5 | 4.7 | 5.6 | 5.9 | 4.4 |
| $E_I$ [kV/cm] | 1.1 | 1.5 | 1.0 | 1.2 | 1.8 | 2.6 | 2.8 | 1.1 |

Since the internal bias electric field $E_I$ which doesn't exist in the general PMN-PT single crystal could be induced sufficiently largely by adjustment of the atmosphere [the size of the oxygen partial-pressure] during the heat treatment process, the novel piezoelectric single crystals having large resistance to external circumstances could be developed Based on the result, with respect to the single crystals of $[Pb_{0.98-1.5x}Sr_{0.02}Sm_x][(Mg_{1/3}Nb_{2/3})_{0.35}Zr_{0.30}Ti_{0.35}]O_{3-z}$ ($0.0{\leq}x{\leq}0.02$; $0{<}z{\leq}0.03$), in case that "x [the donor content]", "z [the oxygen vacancy content]", and "a ratio of x/z" were adjusted, and at the same time as this, the atmosphere [the size of the oxygen partial-pressure] during the heat treatment process was adjusted, it was confirmed that a piezoelectric charge constant, a coercive field $E_C$, and an internal bias electric field $E_I$ of the produced piezoelectric single crystal could be most suitable. Accordingly, the piezoelectric single crystals comprising the oxygen vacancy content in the specific range ($0{<}z{\leq}0.03$) were characteristic in that their high piezoelectric characteristics were stably maintained with respect to a change in external circumstances unlike those shown in the existing general PMN-PT or PIN-PMN-PT single crystals.

As shown in said Table 7, in case of (001) the piezoelectric single crystal (x=0.01, z=0.0) (Comparative Example 6), the piezoelectric charge constant $d_{33}$ was 1,760 pC/N, the dielectric constant was 6, 920, and the dielectric loss tan δ was 0.3%.

On the contrary, physical properties of the piezoelectric single crystal were observed to change largely according to the change in x [the donor content] and 0<z [the oxygen vacancy content]. That is, the result as confirmed was that the and the piezoelectric charge constant dielectric constant increased according to an increase in x [the donor content], and the dielectric constant and the piezoelectric charge constant decreased consecutively according to an increase in 0<z [the oxygen vacancy content], but the coercive field $E_C$ and the internal bias electric field $E_I$ increased.

Accordingly, in case that the values of x [the donor content] and z [the oxygen vacancy content] were beyond fixed values (x≠0.0 and z≠0.0), the dielectric constant and the piezoelectric charge constant were maintained to be similar to those shown in a general PMN-PT single crystal, and at the same time as this, the coercive field $E_C$ and the internal bias electric field $E_I$ could increase largely. In particular, since the internal bias electric field $E_I$ which doesn't exist in the general PMN-PT single crystal could be induced sufficiently largely, the novel piezoelectric single crystals having large resistance to external circumstances could be developed.

<Experimental Example 8> Evaluation 2 on Dielectric and Piezoelectric Characteristics Concerning the Piezoelectric Single Crystal Shown in Example 4

With respect to the single crystals satisfying requisites of "x=0.01 and z=0.005", and "x=0.01 and z=0.01" among the single crystals based on composition of $[Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ ($0.0 \leq x \leq 0.02$; $0.0 \leq z \leq 0.0.03$), after processes for single crystal growth were finished, a third heat treatment process was again carried out, and an atmosphere [a size of oxygen partial-pressure] during the third heat treatment was adjusted so that "z [an oxygen vacancy content]" increased. Each change in characteristics of a dielectric constant, a piezoelectric charge constant, a coercive field $E_C$, and an internal bias electric field $E_I$ of the piezoelectric single crystals after the third heat treatment was measured by the IEEE method using an impedance analyzer, and so on, and was described in Table 8 below.

TABLE 8

| | Example 4-3 | | | Example 4-4 | | |
|---|---|---|---|---|---|---|
| x/z (before heat treatment) | 0.01/0.005 | | | 0.01/0.01 | | |
| z (after heat treatment) | 0.05 | 0.01 | 0.02 | 0.01 | 0.02 | 0.03 |
| Dielectric constant | 6,650 | 6,150 | 5,430 | 6,310 | 5250 | 2,840 |
| $d_{33}$ [pC/N] | 1,710 | 1,600 | 1,510 | 1,630 | 1,500 | 880 |
| $E_c$ [kV/cm] | 4.5 | 4.7 | 5.4 | 4.6 | 5.5 | 5.7 |
| $E_I$ [kV/cm] | 1.2 | 1.9 | 2.2 | 1.8 | 2.3 | 2.6 |

As shown in said Table 8, after the processes for single crystal growth were finished, the third heat treatment was again carried out, and physical properties of the piezoelectric single crystal as well as the oxygen vacancy content [z] were observed to change largely according to a change in the atmosphere [the size of the oxygen partial-pressure] during the heat treatment process. As the size of the oxygen partial-pressure during the heat treatment decreased, the dielectric constant and the piezoelectric charge constant also decreased consecutively, but the coercive field $E_C$ and the internal bias electric field Er increased.

This effect tended to increase more as the values of x [the donor content] and z [the oxygen vacancy content] got larger. Accordingly, when the piezoelectric single crystals comprising x [donor content] and z [the oxygen vacancy content] were produced under the condition that the oxygen partial-pressure was low, the dielectric constant and the piezoelectric charge constant were maintained to be similar to those shown in the general PMN-PT single crystal, and at the same time, the coercive field $E_C$ and the internal bias electric field $E_I$ could increase largely. Since the internal bias electric field $E_I$ which doesn't exist in the general PMN-PT single crystal could be induced sufficiently largely by adjustment of the atmosphere [the size of the oxygen partial-pressure] during the heat treatment process, the novel piezoelectric single crystals having large resistance to external circumstances could be developed.

Based on the result, with respect to the single crystals of $[Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ ($0.0 \leq x \leq 0.02$; $0 < z \leq 0.03$), in case that "x [the donor content]", "z [the oxygen vacancy content]", and "a ratio of x/z" were adjusted, and at the same time as this, the atmosphere [the size of the oxygen partial-pressure] during the heat treatment process was adjusted, it was confirmed that the piezoelectric charge constant, the coercive field $E_C$, and the internal bias electric field $E_I$ of the produced piezoelectric single crystal could be most suitable. Like this, the piezoelectric single crystals comprising the oxygen vacancy content in a specific range ($0 < z \leq 0.02$) were characteristic in that their high piezoelectric characteristics were stably maintained with respect to a change in external circumstances unlike those shown in the existing general PMN-PT or PIN-PMN-PT single crystal.

<Experimental Example 9> Observations on a Change in Internal Bias Electric Field According to a Change in Temperature A measurement sample having a size of "(001) 4×4×0.5 (T) mm" was produced using a general PMN-30PT piezoelectric single crystal, and the piezoelectric single crystals satisfying requisites of "x=0.01 and z=0.0" (Comparative Example 6), and "X=0.01 and z=0.02" (Example 4-5) among the piezoelectric single crystals of $[Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ shown in said Example 2, and the sizes of the coercive field $E_C$ and the internal bias electric field $E_I$ were compared with each other on the basis of the electric polarization to internal bias electric field graph.

FIG. 10 is a graph showing each change in polarization to electric field concerning the piezoelectric single crystals satisfying the requisite of x=0.01 and z=0.0 (Comparative Example 6), and the requisite of x=0.01 and z=0.02 (Example 4-5) among the piezoelectric single crystals of $[Pb_{0.98-1.5x}Sr_{0.02}La_x][(Mg_{1/3}Nb_{2/3})_{0.35}(Mn_{1/3}Nb_{2/3})_{0.05}Zr_{0.25}Ti_{0.35}]O_{3-z}$ according to the present invention, and the general PMN-30PT piezoelectric single crystal.

As a result thereof, a coercive field and an internal bias electric field of the general PMN-30PT piezoelectric single crystal at 25° C. were 2.5 and 0.0 kV/cm [there was no internal bias electric field], respectively, coercive field and an internal bias electric field of the piezoelectric single crystal satisfying the requisite of "x=0.01 and z=0.0" (Comparative Example 6) were 4.4 and 1.0 kV/cm, respectively, and were relatively high. Also, in case of the piezoelectric single crystal satisfying the requisite of "x=0.01 and z=0.02" (Example 4-5) in which the value of z increased more, the coercive field and the internal bias electric field were 5.6 and 3.4 kV/cm, respectively, and increased largely. Based on this result, it was found that the coercive field and the internal bias electric field increased in proportion to an oxygen vacancy content inside of the piezoelectric single crystal increased.

As described above, with respect to the composition of the piezoelectric single crystal, when x [a donor content] and z [an oxygen vacancy content] were adjusted, and at the same time as this, an atmosphere [a size of oxygen partial-pressure] during a heat treatment process was adjusted, z [an oxygen vacancy content] which doesn't exist in a general PMN-PT single crystal could be induced sufficiently largely.

As previously described, although the present invention has been described in detail only with respect to the described concrete examples, it is to be understood that various variations and modifications of the present invention can be made by those having ordinary skill in the art within the scope of the technical ideas of the present invention, and it should be natural that these variations and modifications fall under the accompanying claims.

What is claimed is:

1. A piezoelectric single crystal-with-having a perovskite type structure ([A][B]O$_3$) having an internal bias electric field, the piezoelectric single crystal comprising:

a compositional formula of Chemical Formula 1 below:

$$[A_{1-(a+1.5b)}B_aC_p][(MN)_{1-x-y}(L)_yTi_x]O_{3-z} \qquad \text{Chemical Formula 1}$$

where A represents Pb or Ba; B represents at least one or more elements selected from the group consisting of Ba, Ca, Co, Fe, Ni, Sn, and Sr; C represents one or more elements selected from the group consisting of Co, Fe, Bi, La, Ce, Pr, Nd, Pm, Sm, Eu, Gd, Tb, Dy, Ho, Er, Tm, Yb, and Lu; L represents a single form composed of one selected from Zr, Hf, and a mixed form thereof; M represents at least one or more elements selected from the group consisting of Ce, Co, Fe, In, Mg, Mn, Ni, Sc, Yb, and Zn; N represents at least one or more elements selected from the group consisting of Nb, Sb, Ta, and W; and a, b, x, y, and z represent 0<a≤0.10, 0<b≤0.05, 0.05<x≤0.58, 0.05<y≤0.62, and 0<z≤0.02, respectively; and physical properties presented in items (1) to (4) below:

(1) a dielectric constant K$_3{}^T$ is 4,000 to 15,000;

(2) a piezoelectric charge constant d$_{33}$ is 1,400 to 6,000 pC/N;

(3) a coercive electric field E$_C$ is 3.5 to 12 kV/cm; and (4) an internal bias electric field E$_I$ is 0.5 to 3.0 kV/cm.

2. The piezoelectric single crystal of claim 1, wherein the physical properties are maintained at a temperature of 20 to 80° C.

3. The piezoelectric single crystal of claim 1, wherein when L represents a mixed form, the piezoelectric single crystal is represented by a compositional formula of Chemical Formula 2:

$$[A_{1-(a+1.5b)}B_aC_b][(MN)_{1-x-y}(Zr_{1-w}Hf_w)_yTi_x]O_{3-z} \quad \text{Chemical Formula 2}$$

where A, B, C, M, N, a, b, x, y, and z are the same as those presented in Chemical Formula 1, but w represents 0.01≤w≤0.20.

4. The piezoelectric single crystal of claim 1, wherein in said formulae, a and b represent 0.01≤a≤0.10, 0.01≤b≤0.05, respectively.

5. The piezoelectric single crystal of claim 1, wherein in said formulae, a and b represent a/b>2.

6. The piezoelectric single crystal of claim 1, wherein in said formulae, x and y represent 0.10≤x≤0.58 and 0.10≤y≤0.62, respectively.

7. The piezoelectric single crystal of claim 1, wherein a porosity inside of the single crystal is 0.5 vol % or more.

8. The piezoelectric single crystal of claim 4, wherein a composition gradient internal of the single crystal with respect to the piezoelectric single crystal is formed in a range of 0.2 to 0.5 mol %.

9. The piezoelectric single crystal of claim 1, wherein said x and y belong into a range of within 10 mol % from composition of a morphotropic phase boundary between a rhombohedral phase and a tetragonal phase.

10. The piezoelectric single crystal of claim 1, wherein the piezoelectric single crystal shows that a curie temperature T$_c$ is 180° C. or more, and at the same time as this, a phase transition temperature T$_{RT}$ between the rhombohedral phase and the tetragonal phase is 100° C. or more.

11. The piezoelectric single crystal of claim 1, wherein the piezoelectric single crystal shows that a longitudinal electromechanical coupling coefficient k$_{33}$ is 0.85 or more.

12. A method of manufacturing a piezoelectric single crystal, comprising of:

Step (a) reducing number density of abnormal grains (i.e., the number of abnormal grains/unit area) by adjusting an average size of matrix grains of a polycrystal having composition which constitutes the piezoelectric single crystal according to claim 1;

Step (b) growing the abnormal grains by heat-treating the polycrystal having a reduced number density of the abnormal grains obtained through said Step (a), wherein a power molding substance is obtained in such a manner as to calcine powder based on the composition constituting the piezoelectric single crystal at a temperature of less than 800 to 900° C., and a first heat treatment process of sintering the powder molding substance, and a second heat treatment process required at the time of growth of the single crystal are carried out.

13. The method of claim 12, wherein the first and second heat treatment processes are carried out at 900 to 1,300° C. for 1 to 100 hours.

14. The method of claim 13, wherein the heat treatments are carried out at a temperature-raising rate of 1 to 20° C./min.

15. The method of claim 12, wherein a third heat treatment process is further carried out after growth of the single crystal is completed.

16. The method of claim 15, wherein the third heat treatment process is carried out at 600 to 1,300° C. for 0.1 to 100 hours.

17. The method of claim 15, wherein an oxygen vacancy content (0<z≤0.02) is adjusted by a condition of the oxygen partial-pressure during the third heat treatment process.

18. A piezoelectric body in which the piezoelectric single crystal according to claim 1 is included alone, or the piezoelectric single crystal and a polymer are mixed.

19. A piezoelectric or dielectric application component comprising the piezoelectric body of claim 18.

* * * * *